(12) United States Patent
Kim et al.

(10) Patent No.: US 11,387,286 B2
(45) Date of Patent: Jul. 12, 2022

(54) DISPLAY DEVICE

(71) Applicant: SAMSUNG DISPLAY CO., LTD., Yongin-si (KR)

(72) Inventors: Jang-Il Kim, Asan-si (KR); Jeongki Kim, Hwaseong-si (KR); Jeaheon Ahn, Hwaseong-si (KR); Si-Wan Jeon, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 218 days.

(21) Appl. No.: 16/891,410

(22) Filed: Jun. 3, 2020

(65) Prior Publication Data

US 2021/0036062 A1 Feb. 4, 2021

(30) Foreign Application Priority Data

Jul. 31, 2019 (KR) .......................... 10-2019-0093206

(51) Int. Cl.
*H01L 27/32* (2006.01)
*H01L 51/52* (2006.01)

(52) U.S. Cl.
CPC ........ *H01L 27/322* (2013.01); *H01L 27/3246* (2013.01); *H01L 27/3272* (2013.01); *H01L 2227/323* (2013.01)

(58) Field of Classification Search
CPC ............... H01L 27/322; H01L 27/3246; H01L 27/3272; H01L 27/3276; H01L 27/3232
See application file for complete search history.

(56) References Cited

U.S. PATENT DOCUMENTS

| 2006/0049408 A1* | 3/2006 | Sohn | G02F 1/1333 257/72 |
| 2014/0134770 A1* | 5/2014 | Eom | G02B 5/223 430/6 |
| 2019/0121176 A1* | 4/2019 | Lee | G02F 1/133617 |
| 2019/0148458 A1* | 5/2019 | Kim | H01L 27/322 257/89 |
| 2019/0252470 A1* | 8/2019 | Lee | H01L 27/3216 |

(Continued)

FOREIGN PATENT DOCUMENTS

| KR | 10-2008-0076554 | 8/2008 |
| KR | 10-2013-00 66917 | 6/2013 |
| KR | 10-2015-0064277 | 6/2015 |

*Primary Examiner* — Mohsen Ahmadi
(74) *Attorney, Agent, or Firm* — F. Chau & Associates, LLC

(57) ABSTRACT

A display device including: a lower substrate having a display area and a peripheral area; a plurality of lower electrodes disposed in the display area and on the lower substrate; a pixel defining layer covering a portion of each of the lower electrodes; a light emitting layer disposed on the lower electrodes and the pixel defining layer; an upper electrode disposed on the light emitting layer; a plurality of optical filters disposed on the upper electrode and spaced apart from each other; a lower light blocking layer disposed between the optical filters, and having a plurality of openings; an upper substrate disposed on the lower light blocking layer to oppose the lower substrate; and an alignment structure disposed in the peripheral area of the lower substrate and the upper substrate, and including a material identical to a material of the pixel defining layer and the lower light blocking layer.

17 Claims, 23 Drawing Sheets

(56) References Cited

U.S. PATENT DOCUMENTS

| | | | |
|---|---|---|---|
| 2020/0041709 A1* | 2/2020 | Lee | G02F 1/133617 |
| 2020/0073169 A1* | 3/2020 | Jung | G02F 1/133617 |
| 2020/0081292 A1* | 3/2020 | Park | H01L 27/322 |
| 2020/0083301 A1* | 3/2020 | Bok | H01L 51/5253 |
| 2020/0135811 A1* | 4/2020 | Jung | H01L 51/5284 |
| 2020/0144333 A1* | 5/2020 | Kim | H01L 31/035218 |
| 2020/0217998 A1* | 7/2020 | Jung | H01L 27/322 |
| 2021/0064105 A1* | 3/2021 | Lee | G02F 1/13458 |

\* cited by examiner

DISPLAY DEVICE

CROSS-REFERENCE TO RELATED APPLICATION

This application claims priority under 35 USC § 119 to Korean Patent Application No. 10-2019-0093206 filed on Jul. 31, 2019 in the Korean Intellectual Property Office (KIPO), the disclosure of which is incorporated by reference herein in its entirety.

TECHNICAL FIELD

Exemplary embodiments of the present invention relate generally to a display device. More particularly, exemplary embodiments of the present invention relate to a display device including an optical filter and a color filter.

DISCUSSION OF THE RELATED ART

Flat panel display devices are used as display devices for replacing a cathode ray tube display device due to being relatively lightweight and thin. Examples of flat panel display devices include a liquid crystal display device and an organic light emitting diode display device.

Recently, a display device including a quantum dot layer and a color filter has been under development. Generally, the display device may include a lower substrate and an upper substrate. Further, in a general manufacturing process of the display device, semiconductor elements, lower electrodes, a light emitting layer, an upper electrode, and the like may be formed on a top surface of the lower substrate, and the quantum dot layer and the color filter may be formed on a bottom surface of the upper substrate. Next, after the top surface of the lower substrate and the bottom surface of the upper substrate are arranged to face each other, the lower substrate and the upper substrate may be coupled to each other by a sealing member, thereby manufacturing the display device.

SUMMARY

According to an exemplary embodiment of the present invention, a display device including: a lower substrate having a display area and a peripheral area at least partially surrounding the display area; a plurality of lower electrodes disposed in the display area and on the lower substrate; a pixel defining layer configured to cover a portion of each of the lower electrodes; a light emitting layer disposed on the lower electrodes and the pixel defining layer; an upper electrode disposed on the light emitting layer; a plurality of optical filters disposed on the upper electrode and spaced apart from each other; a lower light blocking layer disposed between the optical filters, and having a plurality of openings; an upper substrate disposed on the lower light blocking layer to oppose the lower substrate; and an alignment structure disposed in the peripheral area of the lower substrate and the upper substrate, and including a material identical to a material of the pixel defining layer and the lower light blocking layer.

In an exemplary embodiment of the present invention, the lower electrodes, the optical filters, and the openings of the lower light blocking layer overlap each other.

In an exemplary embodiment of the present invention, the lower light blocking layer overlaps the pixel defining layer.

In an exemplary embodiment of the present invention, the alignment structure includes: a first alignment pattern disposed on a bottom surface of the upper substrate; and a second alignment pattern disposed on a top surface of the lower substrate.

In an exemplary embodiment of the present invention, the first alignment pattern and the lower light blocking layer include a same material, and the second alignment pattern and the pixel defining layer include a same material.

In an exemplary embodiment of the present invention, the first alignment pattern includes: a reference pattern; and outer peripheral patterns spaced apart from the reference pattern while surrounding the reference pattern.

In an exemplary embodiment of the present invention, the outer peripheral patterns are spaced apart from each other.

In an exemplary embodiment of the present invention, each of the outer peripheral patterns is spaced apart from the reference pattern at a same interval.

In an exemplary embodiment of the present invention, the second alignment pattern includes a first pattern disposed between the reference pattern and the outer peripheral patterns, wherein the first pattern has a rectangular shape including an opening, and wherein the opening of the first pattern overlaps the reference pattern.

In an exemplary embodiment of the present invention, the second alignment pattern includes a first pattern disposed between the reference pattern and the outer peripheral patterns, wherein the first pattern has a rectangular shape including an opening, and wherein the first pattern surrounds the reference pattern without overlapping the reference pattern and the outer peripheral patterns.

In an exemplary embodiment of the present invention, the second alignment pattern includes: a first pattern disposed between the reference pattern and the outer peripheral patterns, wherein the first pattern has a rectangular shape including an opening; and a second pattern disposed between the first pattern and the lower substrate to overlap the reference pattern, the outer peripheral pattern, and the first pattern.

In an exemplary embodiment of the present invention, the second pattern includes a metal material.

In an exemplary embodiment of the present invention, the display device further includes a plurality of color filters disposed between the lower substrate and the upper substrate, wherein the color filters overlap the optical filters, respectively.

In an exemplary embodiment of the present invention, the display device further includes: a first protective insulating layer disposed between the optical filters and the color filters; and a second protective insulating layer disposed between the lower light blocking layer and the optical filters, wherein the first protective insulating layer and the second protective insulating layer make contact with each other between the optical filters.

In an exemplary embodiment of the present invention, the color filters include: a first color filter disposed on a bottom surface of the upper substrate to transmit blue light, and having a plurality of first openings and a plurality of second openings; second color filters respectively disposed in the first openings on the bottom surface of the upper substrate to transmit red light; and third color filters respectively disposed in the second openings on the bottom surface of the upper substrate to transmit green light.

In an exemplary embodiment of the present invention, the display device further includes an upper light blocking layer disposed between the first color filter and the lower light blocking layer, and having a plurality of openings, wherein the openings of the upper light blocking layer overlap the openings of the lower light blocking layer.

In an exemplary embodiment of the present invention, the optical filters include: a first quantum dot pattern disposed on the second color filters to convert the blue light into the red light; a second quantum dot pattern disposed on the third color filters to convert the blue light into the green light; and a scattering pattern disposed on the first color filter to transmit the blue light.

In an exemplary embodiment of the present invention, the first color filter includes an opening area and a light transmission area, the first and second openings are located in the opening area, and the scattering pattern overlaps the light transmission area.

In an exemplary embodiment of the present invention, the display device further includes: a thin film encapsulation structure disposed in the display area between the upper electrode and the lower light blocking layer; and a sealing member surrounding the display area in the peripheral area between the lower substrate and the upper substrate.

In an exemplary embodiment of the present invention, the light emitting layer is configured to emit blue light, and the light emitting layer is integrally formed in the display area on the lower substrate.

According to an exemplary embodiment of the present invention, a display device includes: a lower substrate having a first area and a second area at least partially surrounding the first area; a plurality of lower electrodes disposed in the first area and on the lower substrate; a pixel defining layer disposed on a portion of each of the lower electrodes; a light emitting layer disposed on the lower electrodes and the pixel defining layer; an upper electrode disposed on the light emitting layer; a plurality of optical filters disposed on the upper electrode and spaced apart from each other; a lower light blocking layer disposed between the optical filters, and having a plurality of openings; an upper substrate opposing the lower substrate; and an alignment structure disposed in the second area of the lower substrate and the upper substrate, and including a first alignment pattern and a second alignment pattern, wherein the first alignment pattern is disposed on a lower surface of the upper substrate, and the second alignment pattern is disposed on an upper surface of the lower substrate.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Figure 1:
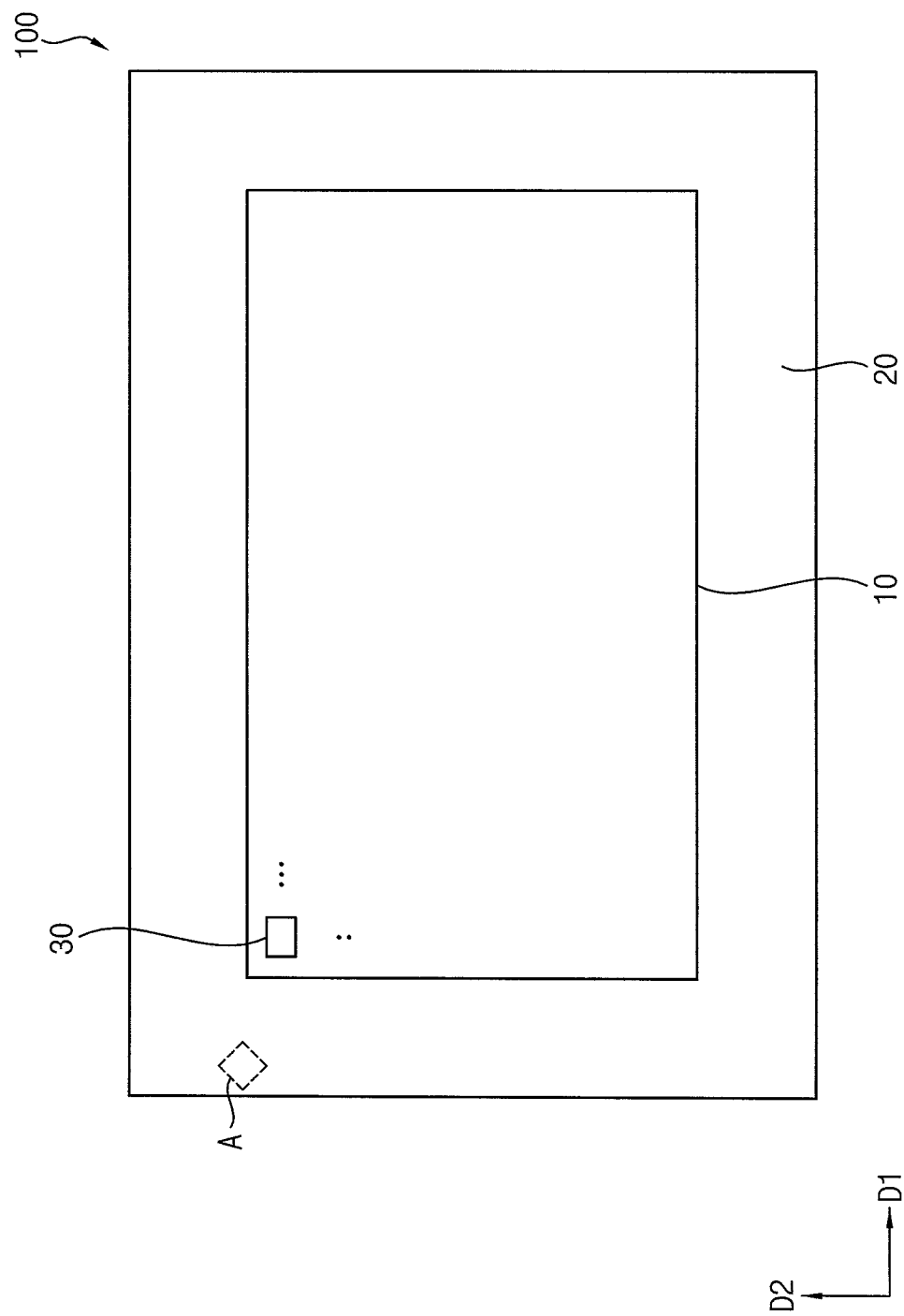
FIG. 1 is a plan view showing a display device according to an exemplary embodiment of the present invention.

Hereinafter, display devices and a method of manufacturing a display device according to an exemplary embodiment of the present invention will be described in detail with reference to the accompanying drawings. In the accompanying drawings, same or similar reference numerals may refer to the same or similar elements, and thus repetitive descriptions may be omitted.

Figure 2:
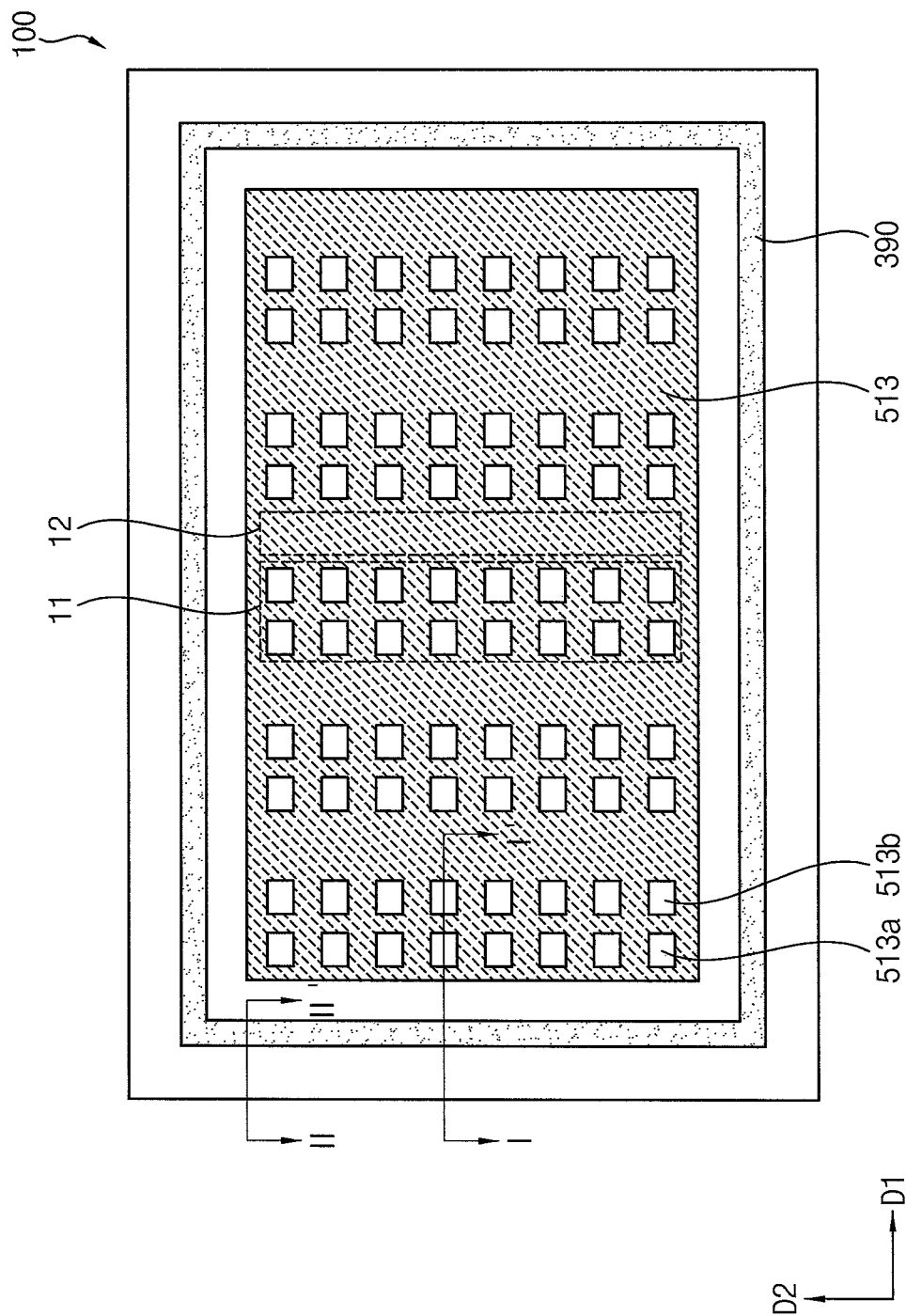
FIG. 2 is a plan view showing a first color filter included in the display device of FIG. 1.
Figure 3:
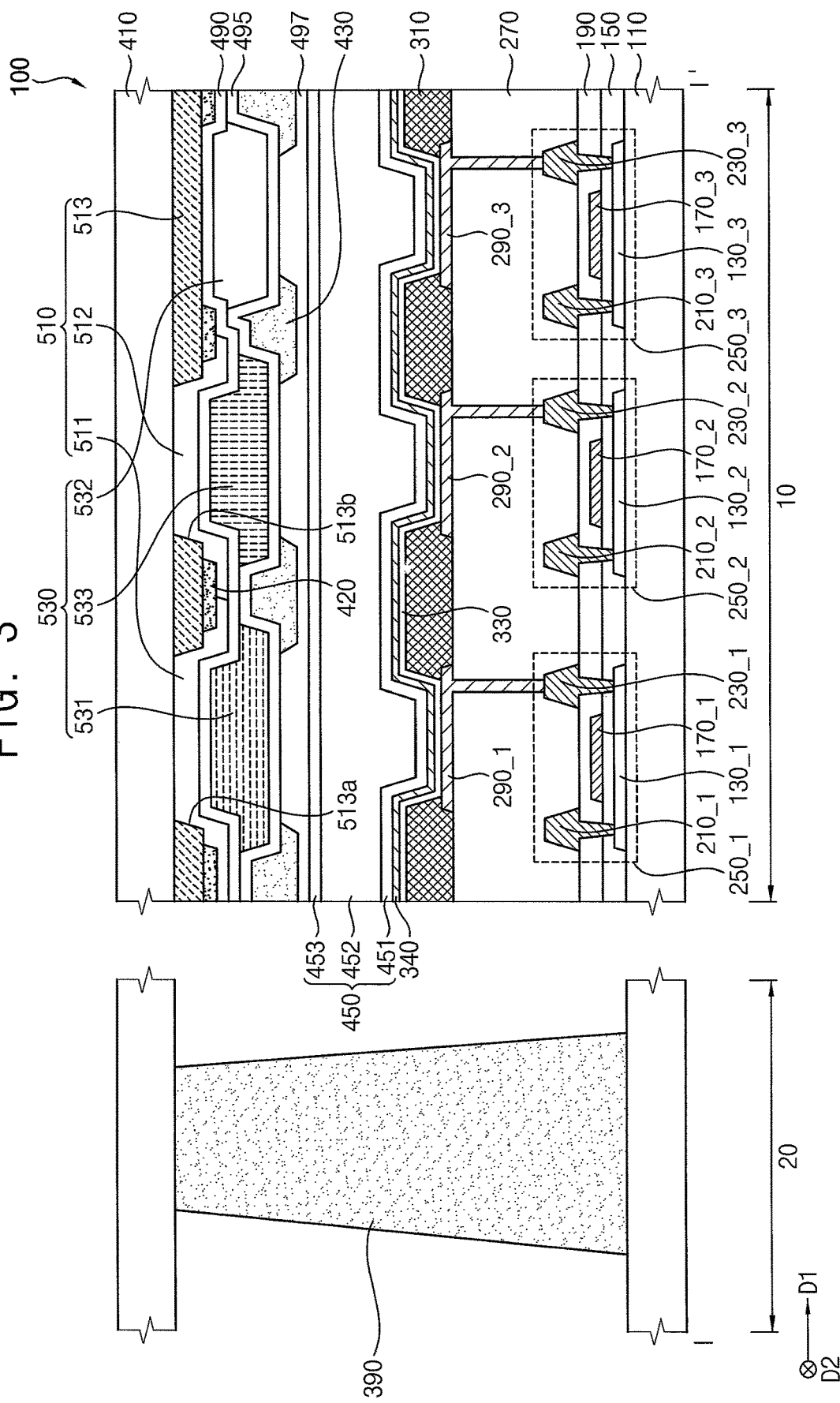
FIG. 3 is a sectional view taken along line I-I' of FIG. 2.

FIG. 1 is a plan view showing a display device according to an exemplary embodiment of the present invention, FIG. 2 is a plan view showing a first color filter included in the display device of FIG. 1, and FIG. 3 is a sectional view taken along line I-I' of FIG. 2.

Referring to FIGS. 1, 2, and 3, a display device 100 may include a lower substrate 110, a first semiconductor element 250_1, a second semiconductor element 2502, a third semiconductor element 250_3, a gate insulating layer 150, an insulating interlayer 190, a planarization layer 270, a first lower electrode 290_1, a second lower electrode 290_2, a third lower electrode 290_3, a light emitting layer 330, an upper electrode 340, a thin film encapsulation structure 450, a first protective insulating layer 490, a second protective insulating layer 495, a plurality of optical filters 530, an intermediate layer 497, a plurality of color filters 510, an upper light blocking layer 420, a lower light blocking layer 430, a sealing member 390, an upper substrate 410, etc.

In this case, the first lower electrode 290_1, the light emitting layer 330, and the upper electrode 340 form a first sub-pixel structure. In addition, the second lower electrode 290_2, the light emitting layer 330, and the upper electrode 340 form a second sub-pixel structure. Further, the third lower electrode 290_3, the light emitting layer 330, and the upper electrode 340 form a third sub-pixel structure. The first semiconductor element 250_1 may include a first active layer 130_1, a first gate electrode 170_1, a first source electrode 210_1, and a first drain electrode 230_1. In addition, the second semiconductor element 250_2 may include a second active layer 130_2, a second gate electrode 170_2, a second source electrode 210_2, and a second drain electrode 230_2, and the third semiconductor element 250_3 may include a third active layer 130_3, a third gate electrode 170_3, a third source electrode 210_3, and a third drain electrode 230_3. In addition, the thin film encapsulation structure 450 may include a first thin film encapsulation layer 451, a second thin film encapsulation layer 452, and a third thin film encapsulation layer 453. In addition, the optical filters 530 may include a first quantum dot pattern 531, a scattering pattern 532, and a second quantum dot pattern 533. Further, the color filters 510 may include a first color filter 513, a second color filter 511, and a third color filter 512.

As shown in FIG. 1, the display device 100 may include a display area 10 and a peripheral area 20 at least partially surrounding the display area 10. In this case, the display area 10 may include a plurality of sub-pixel areas 30. The sub-pixel areas 30 may be arranged over the display area 10 in the form of a matrix.

One of the first to third sub-pixel structures may be disposed in each of the sub-pixel areas 30, and the display device 100 may display an image through the first to third sub-pixel structures. The sealing member 390 and an alignment structure 400 which will be described with reference to FIGS. 4 and 5 may be disposed in the peripheral area 20, and the peripheral area 20 may correspond to a non-display area. For example, a plurality of transistors, a plurality of capacitors, a plurality of signal wires (e.g., gate signal wires, data signal wires, high power supply voltage wires, light emission signal wires, initialization signal wires, etc.), and the like may be additionally disposed in the display area 10, and a plurality of signal wires, a gate driver, a data driver, and the like may be additionally disposed in the peripheral area 20.

Although the alignment structure 400 has been described as being disposed in region 'A' of FIG. 1, a position of the alignment structure 400 is not limited thereto. For example, the alignment structure 400 may be disposed in a portion of the peripheral area 20. In an exemplary embodiment of the present invention, the alignment structure 400 may be disposed in the display area 10 while being adjacent to the sealing member 390.

In addition, although the display device 100 has been described as including one alignment structure 400, the configuration of the present invention is not limited thereto. For example, the display device 100 may include at least two alignment structures.

As shown in FIG. 2, the first color filter 513 may be disposed in the display area 10. The first color filter 513 may include an opening area 11 and a light transmission area 12. In addition, the first color filter 513 may have a plurality of first openings 513a and a plurality of second openings 513b. In this case, the first openings 513a and the second openings 513b may be located in the opening area 11. For example, the second openings 513b may be spaced apart from the first openings 513a in a first direction D1 parallel to a top surface of the display device 100, respectively. The first openings 513a may be spaced apart from each other in a second direction D2 orthogonal to the first direction D1, and the second openings 513b may also be spaced apart from each other in the second direction D2. In other words, the first openings 513a and the second openings 513b may be parallel to each other. The first openings 513a and the second openings 513b disposed in one opening area 11 may be repeatedly arranged along the first direction D1. In other words, the sub-pixel areas 30 located in the opening area 11 may overlap the first openings 513a and the second openings 513b. For example, the first openings 513a and the first sub-pixel structure may overlap each other, and the second openings 513b and the second sub-pixel structure may overlap each other. Furthermore, no opening may be formed in the light transmission area 12. The sub-pixel areas 30 located in the light transmission area 12 may overlap the third sub-pixel structure, and a portion overlapping the sub-pixel areas 30 located in the light transmission area 12 may function as the first color filter 513.

Although each of the display area 10, the peripheral area 20, and the sub-pixel area 30 of the present invention has been described as having a rectangular shape when viewed in a plan view, the shape is not limited thereto. For example, each of the display area 10, the peripheral area 20, and the sub-pixel area 30 may have a triangular shape, a rhombic shape, a polygonal shape, a circular shape, or an elliptical shape when viewed in a plan view.

Referring again to FIG. 3, the lower substrate 110 including a transparent or opaque material may be provided. The lower substrate 110 may include, for example, a quartz substrate, a synthetic quartz substrate, a calcium fluoride substrate, a fluorine-doped quartz substrate (F-doped quartz substrate), a soda lime glass substrate, a non-alkali glass substrate, etc. As described above, the display device 100 may include the display area 10 including the sub-pixel areas 30 and the peripheral area 20 surrounding the display area 10. Since the display device 100 includes the display area 10 and the peripheral area 20, the lower substrate 110 may also be divided into the display area 10 and the peripheral area 20.

In an exemplary embodiment of the present invention, the lower substrate 110 may be formed of a transparent resin substrate having flexibility. Examples of the transparent resin substrate that may be used as the lower substrate 110 include a polyimide substrate. In this case, the polyimide substrate may have a laminated structure including a first polyimide layer, a barrier film layer, a second polyimide layer, etc.

A buffer layer may be disposed in the display area 10 and on the lower substrate 110. The buffer layer may be disposed over the lower substrate 110. The buffer layer may prevent metal atoms and/or impurities from diffusing from the lower substrate 110 to the semiconductor element and the sub-pixel structure, and may control a heat transfer rate during a crystallization process for forming the active layer to obtain a substantially uniform active layer. In addition, when a surface of the lower substrate 110 is not uniform, the buffer layer may serve to increase flatness of the surface of the lower substrate 110. Depending on a type of the lower substrate 110, at least two buffer layers may be provided on the lower substrate 110, or the buffer layer may not be provided. However, the present invention is not limited thereto; for example, one buffer layer may be provided on the lower substrate 110. For example, the buffer layer may include an organic material or an inorganic material.

In addition, a metal layer may be disposed between the lower substrate 110 and the buffer layer. In an exemplary embodiment of the present invention, when the lower substrate 110 includes a polyimide substrate, the metal layer may be disposed between the first polyimide layer and the barrier film layer or between the barrier film layer and the second polyimide layer. The metal layer may function as, for example, a gate signal line, a data signal line, a high power supply voltage line, a light emission signal line, and an initialization signal line. In addition, the metal layer may function as a back gate of each of the first to third semiconductor elements 250_1, 250_2, and 250_3. The metal layer may include, for example, a metal, an alloy, metal nitride, conductive metal oxide, a transparent conductive material, etc. These may be used alone or in combination with each other.

The first to third active layers 130_1, 130_2, and 130_3 may be spaced apart from each other in the display area 10 on the lower substrate 110. For example, each of the first to third active layers 130_1, 130_2, and 130_3 may include a metal oxide semiconductor, an inorganic semiconductor (e.g., amorphous silicon or poly silicon semiconductor), an organic semiconductor, or the like, and may include a source region and a drain region.

The gate insulating layer 150 may be disposed on the first to third active layers 130_1, 130_2, and 130_3. The gate insulating layer 150 may cover the first to third active layers 130_1, 130_2, and 130_3 in the display area 10 on the lower substrate 110, and may be disposed over the lower substrate 110. In an exemplary embodiment of the present invention, the gate insulating layer 150 may be disposed in the peripheral area 20 and on the lower substrate 110.

For example, the gate insulating layer 150 may sufficiently cover the first to third active layers 130_1, 130_2, and 130_3 on the lower substrate 110, and may have a substantially flat top surface without creating a step around the first to third active layers 130_1, 130_2, and 130_3. In an exemplary embodiment of the present invention, the gate insulating layer 150 may be disposed along a profile of the first to third active layers 130_1, 130_2, and 130_3 with a substantially uniform thickness to cover the first to third active layers 130_1, 130_2, and 130_3 on the lower substrate 110. The gate insulating layer 150 may include, for example, a silicon compound, metal oxide, etc. For example, the gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), etc. In an exemplary embodiment of the present invention, the gate insulating layer 150 may be a multilayer structure including a plurality of insulating layers or may be a single layer structure. For example, the insulating layers may have mutually different thicknesses or may include mutually different materials.

The first to third gate electrodes 170_1, 170_2, and 170_3 may be spaced apart from each other on the gate insulating layer 150. For example, the first gate electrode 170_1 may be disposed at a portion of the gate insulating layer 150 under which the first active layer 130_1 is located, the second gate electrode 170_2 may be disposed at a portion of the gate insulating layer 150 under which the second active layer 130_2 is located, and the third gate electrode 170_3 may be disposed at a portion of the gate insulating layer 150 under which the third active layer 130_3 is located. Each of the first to third gate electrodes 170_1, 170_2, and 170_3 may include, for example, a metal, an alloy, metal nitride, conductive metal oxide, a transparent conductive material, etc. For example, each of the first to third gate electrodes 170_1, 170_2, and 170_3 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), etc. These may be used alone or in combination with each other. In an exemplary embodiment of the present invention, each of the first to third gate electrodes 170_1, 170_2, and 170_3 may be a multilayer structure including a plurality of metal layers or may be a single layer structure. For example, the metal layers may have mutually different thicknesses or may include mutually different materials.

The insulating interlayer 190 may be disposed on the first to third gate electrodes 170_1, 170_2, and 170_3. The insulating interlayer 190 may cover the first to third gate electrodes 170_1, 170_2, and 170_3 disposed on the gate insulating layer 150 in the display area 10, and may be disposed over the gate insulating layer 150. In an exemplary embodiment of the present invention, the insulating interlayer 190 may be disposed in the peripheral area 20 and on the lower substrate 110.

For example, the insulating interlayer 190 may sufficiently cover the first to third gate electrodes 170_1, 170_2, and 170_3 disposed on the gate insulating layer 150, and may have a substantially flat top surface without creating a step around the first to third gate electrodes 170_1, 170_2, and 170_3. In an exemplary embodiment of the present invention, the insulating interlayer 190 may be disposed along a profile of the first to third gate electrodes 170_1, 170_2, and 170_3 with a substantially uniform thickness to cover the first to third gate electrodes 170_1, 170_2, and 170_3 on the gate insulating layer 150. The insulating interlayer 190 may include, for example, a silicon compound, metal oxide, etc. In an exemplary embodiment of the present invention, the insulating interlayer 190 may be a multilayer structure including a plurality of insulating layers or may be a single layer structure. For example, the insulating layers may have mutually different thicknesses or may include mutually different materials.

The first source electrode 210_1, the first drain electrode 230_1, the second source electrode 210_2, the second drain electrode 230_2, and the third source electrode 210_3, and the third drain electrode 230_3 may be spaced apart from each other in the display area 10 and on the insulating interlayer 190. For example, the first source electrode 210_1 may be connected to the source region of the first active layer 130_1 through a contact hole formed by removing first portions of the gate insulating layer 150 and the insulating interlayer 190, and the first drain electrode 230_1 may be connected to the drain region of the first active layer 130_1 through a contact hole formed by removing second portions of the gate insulating layer 150 and the insulating interlayer 190. In addition, the second source electrode 210_2 may be connected to the source region of the second active layer 130_2 through a contact hole formed by removing third portions of the gate insulating layer 150 and the insulating interlayer 190, and the second drain electrode 230_2 may be connected to the drain region of the second active layer 130_2 through a contact hole formed by removing fourth portions of the gate insulating layer 150 and the insulating interlayer 190. Furthermore, the third source electrode 210_3 may be connected to the source region of the third active layer 130_3 through a contact hole formed by removing fifth portions of the gate insulating layer 150 and the insulating interlayer 190, and the third drain electrode 230_3 may be connected to the drain region of the third active layer 130_3 through a contact hole formed by removing sixth portions of the gate insulating layer 150 and the insulating interlayer 190. Each of the first to third source electrodes 210_1, 210_2, and 210_3 and the first to third drain electrodes 230_1, 230_2, and 230_3 may include, for example, a metal, an alloy, metal nitride, conductive metal oxide, a transparent conductive material, etc. These may be used alone or in combination with each other. In an exemplary embodiment of the present invention, each of the first to third source electrodes 210_1, 210_2, and 210_3 and the first to third drain electrodes 230_1, 230_2, and 230_3 may be a multilayer structure including a plurality of metal layers or may be a single layer structure. For example, the metal layers may have mutually different thicknesses or may include mutually different materials.

Accordingly, the first semiconductor element 250_1 including the first active layer 130_1, the first gate electrode 170_1, the first source electrode 210_1, and the first drain electrode 230_1 may be provided. In addition, the second semiconductor element 250_2 including the second active layer 130_2, the second gate electrode 170_2, the second source electrode 210_2, and the second drain electrode 230_2 may be provided. Further, the third semiconductor element 250_3 including the third active layer 130_3, the third gate electrode 170_3, the third source electrode 210_3, and the third drain electrode 230_3 may be provided.

Although the display device 100 has been described as including three transistors (e.g. the first to third semiconductor elements 250_1, 250_2, and 250_3), the configuration of the present invention is not limited thereto. For example, the display device 100 may include a plurality of transistors and a plurality of capacitors.

In addition, although each of the first to third semiconductor elements 250_1, 250_2, and 250_3 has been described as having a top gate structure, the configuration of the present invention is not limited thereto. For example, each of the first to third semiconductor elements 250_1, 250_2, and 250_3 may have a bottom gate structure and/or a double gate structure.

Furthermore, although each of the first to third semiconductor elements 250_1, 250_2, and 250_3 has been described as not including the gate insulating layer 150 and the insulating interlayer 190, the present invention is limited thereto. For example, each of the first to third semiconductor elements 250_1, 250_2, and 250_3 may include the gate insulating layer 150 and the insulating interlayer 190.

The planarization layer 270 may be disposed in the display area 10 and on the insulating interlayer 190 and the first to third semiconductor elements 250_1, 250_2, and 250_3, and may not be disposed in the peripheral area 20. For example, the planarization layer 270 may have a relatively thick thickness to sufficiently cover the first to third source electrodes 210_1, 210_2, and 210_3 and the first to third drain electrodes 230_1, 230_2, and 230_3 disposed on the insulating interlayer 190. In this case, the planarization layer 270 may have a substantially flat top surface. To implement such a flat top surface of the planarization layer 270, a platinization process may be additionally performed on the planarization layer 270. The planarization layer 270 may include, for example, an organic material, an inorganic material, or the like. In an exemplary embodiment of the present invention, the planarization layer 270 may include an organic material.

The first to third lower electrodes 290_1, 290_2, and 290_3 may be spaced apart from each other in the display area 10 and on the planarization layer 270. For example, the first lower electrode 290_1 may be disposed on a first portion of the planarization layer 270. In addition, the second lower electrode 290_2 may be disposed on a second portion of the planarization layer 270, and the third lower electrode 290_3 may be disposed on a third portion of the planarization layer 270. In this case, the third portion of the planarization layer 270 may be spaced apart from the first portion, and the second portion of the planarization layer 270 may be located between the first portion and the third portion. In other words, the first portion may overlap the first opening 513a, the second portion may overlap the second opening 513b, and the third portion may overlap the sub-pixel area 30 located in the light transmission area 12.

The first to third lower electrodes 290_1, 290_2, and 290_3 may be respectively connected to the first to third drain electrodes 230_1, 230_2, and 230_3 by passing through the planarization layer 270, respectively. In other words, the first to third lower electrodes 290_1, 290_2, and 290_3 may be electrically connected to the first to third semiconductor elements 250_1, 250_2, and 250_3, respectively. Each of the first to third lower electrodes 290_1, 290_2, and 290_3 may include a metal, an alloy, metal nitride, conductive metal oxide, a transparent conductive material, etc. These materials may be used alone or in combination with each other. In an exemplary embodiment of the present invention, each of the first to third lower electrodes 290_1, 290_2, and 290_3 may have a multilayer structure including a plurality of metal layers or may be a single layer structure. For example, the metal layers may have mutually different thicknesses or may include mutually different materials.

The pixel defining layer 310 may be disposed in the display area 10 and on a portion of each of the first to third lower electrodes 290_1, 290_2, and 290_3 and the planarization layer 270, and may not be disposed in the peripheral area 20. The pixel defining layer 310 may cover both sides (e.g., an outer peripheral portion) of each of the first to third lower electrodes 290_1, 290_2, and 290_3, and may allow a portion of a top surface of each of the first to third lower electrodes 290_1, 290_2, and 290_3 to be exposed. The pixel defining layer 310 may be formed of an organic material or an inorganic material. In an exemplary embodiment of the present invention, the pixel defining layer 310 may include an organic material. For example, the pixel defining layer 310 may include a photoresist, a polyacryl-based resin, a polyimide-based resin, a polyamide-based resin, a siloxane-based resin, an acryl-based resin, an epoxy-based resin, etc.

The light emitting layer 330 may be disposed in the display area 10 and on the pixel defining layer 310 and the top surface of each of the first to third lower electrodes 290_1, 290_2, and 290_3 exposed by the pixel defining layer 310. In other words, the light emitting layer 330 may be continuously arranged in the display area 10 and on the lower substrate 110, and may be integrally formed in the display area 10. In an exemplary embodiment of the present invention, the light emitting layer 330 may be formed by using a light emitting material for emitting blue light. In addition, the light emitting layer 330 may be formed by laminating a plurality of light emitting materials for emitting different color lights such as red light, green light, and blue light to emit white light as a whole.

The upper electrode 340 may be disposed in the display area 10 and on the pixel defining layer 310 and the light emitting layer 330. The upper electrode 340 may include, for example, a metal, an alloy, metal nitride, conductive metal oxide, a transparent conductive material, etc. These materials may be used alone or in combination with each other. In an exemplary embodiment of the present invention, the upper electrode 340 may have a multilayer structure including a plurality of metal layers or may be a single layer structure. For example, the metal layers may have mutually different thicknesses or may include mutually different materials.

Accordingly, the first sub-pixel structure including the first lower electrode 290_1, the light emitting layer 330, and the upper electrode 340 may be provided. In addition, the second sub-pixel structure including the second lower electrode 290_2, the light emitting layer 330, and the upper electrode 340 may be provided, and the third sub-pixel structure including the third lower electrode 290_3, the light emitting layer 330, and the upper electrode 340 may be provided.

The first thin film encapsulation layer 451 may be disposed on the upper electrode 340. The first thin film encapsulation layer 451 may be disposed along a profile of the upper electrode 340 with a substantially uniform thickness to cover the upper electrode 340. In an exemplary embodiment of the present invention, the first thin film encapsulation layer 451 may be disposed in the peripheral area 20 and on the lower substrate 110. The first thin film encapsulation layer 451 may prevent the first to third sub-pixel structures from being deteriorated due to penetration of moisture, oxygen, or the like. In addition, the first thin film encapsulation layer 451 may also function to protect the first to third sub-pixel structures from an external impact. The first thin film encapsulation layer 451 may include inorganic materials having flexibility.

The second thin film encapsulation layer 452 may be disposed on the first thin film encapsulation layer 451. The second thin film encapsulation layer 452 may increase flatness of the display device 100 and protect the first to third sub-pixel structures. The second thin film encapsulation layer 452 may include organic materials having flexibility.

The third thin film encapsulation layer 453 may be disposed on the second thin film encapsulation layer 452. The third thin film encapsulation layer 453 may be disposed along a profile of the second thin film encapsulation layer 452 with a substantially uniform thickness to cover the second thin film encapsulation layer 452. In an exemplary embodiment of the present invention, the third thin film encapsulation layer 453 may be disposed in the peripheral area 20 and on the lower substrate 110. The third thin film encapsulation layer 453 may prevent the first to third sub-pixel structures from being deteriorated due to the penetration of moisture, oxygen, or the like together with the first thin film encapsulation layer 451. In addition, the third thin film encapsulation layer 453 may also function to protect the first to third sub-pixel structures from an external impact together with the first thin film encapsulation layer 451 and the second thin film encapsulation layer 452. The third thin film encapsulation layer 453 may include inorganic materials having flexibility.

Accordingly, the thin film encapsulation structure 450 including the first thin film encapsulation layer 451, the second thin film encapsulation layer 452, and the third thin film encapsulation layer 453 may be disposed between the lower light blocking layer 430 and the upper electrode 340. In an exemplary embodiment of the present invention, the thin film encapsulation structure 450 may have a five-layer structure formed by laminating first to fifth thin film encapsulation layers or a seven-layer structure formed by laminating first to seventh thin film encapsulation layers.

The upper substrate 410 may be disposed on the thin film encapsulation structure 450. The upper substrate 410 may oppose (or, e.g., face) the lower substrate 110. The upper substrate 410 and the lower substrate 110 may include substantially the same material. For example, the upper substrate 410 may include a quartz substrate, a synthetic quartz substrate, a calcium fluoride substrate, a fluorine-doped quartz substrate, a soda lime glass substrate, a non-alkali glass substrate, etc.

The first color filter 513 may be disposed in the display area 10 and on the upper substrate 410. For example, the first color filter 513 may be disposed on a bottom surface of the upper substrate 410. As described above, the first color filter 513 may have first openings 513a and second openings 513b in the display area 10. In an exemplary embodiment of the present invention, the first color filter 513 may transmit blue light, and may be a color filter having a blue color.

The upper light blocking layer 420 may be disposed on a bottom surface of the first color filter 513. In other words, the upper light blocking layer 420 may be disposed between the first color filter 513 and the lower light blocking layer 430. The upper light blocking layer 420 may include a plurality of openings. For example, the upper light blocking layer 420 may have a plate shape including a plurality of openings. The openings may correspond to the sub-pixel areas 30, respectively. In addition, the openings of the upper light blocking layer 420 located in the opening area 11 of the first color filter 513 may overlap the first openings 513a and the second openings 513b, and the openings of the upper light blocking layer 420 located in the light transmission area 12 of the first color filter 513 may overlap the first color filter 513 serving as a color filter.

The upper light blocking layer 420 may block or absorb light incident from an outside. The upper light blocking layer 420 may include an organic material such as a photoresist, a polyacryl-based resin, a polyimide-based resin, a polyamide-based resin, a siloxane-based resin, an acryl-based resin, or an epoxy-based resin. In addition, the upper light blocking layer 420 may be substantially opaque. For example, the upper light blocking layer 420 may further include a light blocking material to absorb the light. The light blocking material may include, for example, carbon black, titanium nitride oxide, titanium black, phenylene black, aniline black, cyanine black, nigrosine acid black, a black resin, and the like. In an exemplary embodiment of the present invention, the upper light blocking layer 420 may not be disposed on the bottom surface of the first color filter 513.

The second color filter 511 may be disposed in the first opening 513a of the first color filter 513 and the opening of the upper light blocking layer 420 that is overlapping the first opening 513a. In addition, the second color filter 511 may be disposed on the bottom surface of the upper substrate 410. In addition, a portion of the second color filter 511 may be disposed on a portion of a bottom surface of the upper light blocking layer 420. In tan exemplary embodiment of the present invention, the second color filter 511 may transmit red light, and may be a color filter having a red color.

The third color filter 512 may be disposed in the second opening 513b of the first color filter 513 and the opening of the upper light blocking layer 420 that is overlapping the second opening 513b. In addition, the third color filter 512 may be disposed on the bottom surface of the upper substrate 410. In addition, a portion of the third color filter 512 may be disposed on a portion of the bottom surface of the upper light blocking layer 420, and may make contact with or overlap the second color filter 511 on the bottom surface of the upper light blocking layer 420. In an exemplary embodiment of the present invention, the third color filter 512 may transmit green light, and may be a green color filter.

Accordingly, the color filters 510 including the first color filter 513, the second color filter 511, and the third color filter 512 may be provided. The color filters 510 may include a photosensitive resin and a color photoresist.

Although the color filters 510 of the present invention have been described as including a green color filter, a blue color filter, and a red color filter, the configuration of the present invention is not limited thereto. For example, the color filters 510 may include a yellow color filter pattern, a cyan color filter pattern, and a magenta color filter pattern.

In addition, although the red color filter, the green color filter, and the blue color filter of the present invention have been described as being sequentially arranged, the configuration of the present invention is not limited thereto. For example, the arrangement of the color filters may be changed.

The first protective insulating layer 490 may be disposed on the color filters 510 and the upper light blocking layer 420. For example, the first protective insulating layer 490 may be disposed under the color filters 510 and the upper light blocking layer 420. The first protective insulating layer 490 may cover the color filters 510 and the upper light blocking layer 420 on the bottom surface of the upper substrate 410. For example, the first protective insulating layer 490 may be disposed along a profile of the color filters 510 and the upper light blocking layer 420 with a substantially uniform thickness to cover the color filters 510 and the upper light blocking layer 420 on the bottom surface of the upper substrate 410. In an exemplary embodiment of the present invention, the first protective insulating layer 490 may sufficiently cover the color filters 510 and the upper light blocking layer 420 on the bottom surface of the upper substrate 410, and may have a substantially flat top surface without creating a step around the color filters 510 and the upper light blocking layer 420. The first protective insulating layer 490 may include an inorganic material or an organic material. In an exemplary embodiment of the present invention, the first protective insulating layer 490 may have a multilayer structure including a plurality of insulating layers or may be a single layer structure. For example, the insulating layers may have mutually different thicknesses or may include mutually different materials.

The optical filters 530 may be disposed on the bottom surface of the first protective insulating layer 490 to overlap the color filters 510. The optical filters 530 may include a first quantum dot pattern 531 for converting blue light into red light, a second quantum dot pattern 533 for converting the blue light into green light, and a scattering pattern 532 for transmitting the blue light.

The first quantum dot pattern 531 may be disposed under the second color filter 511 to overlap the second color filter 511, the second quantum dot pattern 533 may be disposed under the third color filter 512 to overlap the third color filter 512, and the scattering pattern 532 may be disposed under the first color filter 513 to overlap the first color filter 513 (or the light transmission area 12). In other words, the first quantum dot pattern 531 may be disposed on the first sub-pixel structure, the second quantum dot pattern 533 may be disposed on the second sub-pixel structure, and the scattering pattern 532 may be disposed on the third sub-pixel structure. In an exemplary embodiment of the present invention, the first quantum dot pattern 531, the second quantum dot pattern 533, and the scattering pattern 532 may be spaced apart from each other, and may be disposed on the same layer. The first quantum dot pattern 531 may include a plurality of quantum dots for absorbing the blue light and emitting the red light, the second quantum dot pattern 533 may include a plurality of quantum dots for absorbing the blue light and emitting the green light, and the scattering pattern 532 may include a scattering material for emitting the blue light as it is.

For example, the quantum dots included in the first quantum dot pattern 531 and the second quantum dot pattern 533 may be nanocrystals including a silicon (Si)-based nanocrystal, a group II-VI compound-based semiconductor nanocrystal, a group III-V compound-based semiconductor nanocrystal, a group IV-VI compound-based semiconductor nanocrystal, and mixtures thereof. The group II-VI compound-based semiconductor nanocrystal may be one of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and/or HgZnSTe. The group III-V compound-based semiconductor nanocrystal may be one of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and/or InAlPAs. The group IV-VI compound-based semiconductor nanocrystal may be SbTe.

Even if the quantum dots included in the first and second quantum dot patterns 531 and 532 include the same material, an emission wavelength may vary according to a size of the quantum dot. For example, as the size of the quantum dot becomes smaller, light having a shorter wavelength may be emitted. Therefore, light within a desired visible light range may be emitted by controlling the sizes of the quantum dots included in the first and second quantum dot patterns 531 and 532.

In an exemplary embodiment of the present invention, the quantum dots included in the first quantum dot pattern 531 and the second quantum dot pattern 533 may be formed of the same material, and the sizes of the quantum dots included in the first quantum dot pattern 531 may be larger than the sizes of the quantum dots included in the second quantum dot pattern 533.

The scattering pattern 532 may include, for example, TiO, ZrO, $AlO_3$, $In_2O_3$, ZnO, $SnO_2$, $Sb_2O_3$, ITO, etc. However, the material of the scattering pattern 532 is not limited thereto, and may vary as long as the material allows the blue light to be scattered without being converted.

Although the first quantum dot pattern 531, the second quantum dot pattern 533, and the scattering pattern 532 of the present invention have been described as being sequentially arranged, the configuration of the present invention is not limited thereto. For example, the arrangement of the first quantum dot pattern 531, the second quantum dot pattern 533, and the scattering pattern 532 may be changed.

Accordingly, the optical filters 530 including the first quantum dot pattern 531, the second quantum dot pattern 533, and the scattering pattern 532 may be provided.

The second protective insulating layer 495 may be disposed on the optical filters 530 and the first protective insulating layer 490. For example, the second protective insulating layer 495 may be disposed under the optical filters 530 and the first protective insulating layer 490. The second protective insulating layer 495 may cover the optical filters 530 on a bottom surface of the first protective insulating layer 490. In an exemplary embodiment of the present invention, the second protective insulating layer 495 may make contact with the first protective insulating layer 490 at a space between the optical filters 530. For example, the second protective insulating layer 495 may be disposed along a profile of the optical filters 530 with a substantially uniform thickness to cover the optical filters 530 on the bottom surface of the first protective insulating layer 490. In an exemplary embodiment of the present invention, the second protective insulating layer 495 may cover the optical filters 530 on the bottom surface of the first protective insulating layer 490, and may have a substantially flat top surface without creating a step around the optical filters 530. The second protective insulating layer 495 may include an inorganic material or an organic material. In an exemplary embodiment of the present invention, the second protective insulating layer 495 may have a multilayer structure including a plurality of insulating layers or may be a single layer structure. For example, the insulating layers may have mutually different thicknesses or may include mutually different materials.

The lower light blocking layer 430 may be disposed on the second protective insulating layer 495. For example, the lower light blocking layer 430 may be disposed on a bottom surface of the second protective insulating layer 495. The lower light blocking layer 430 may be disposed at the space formed between the optical filters 530 on the bottom surface of the second protective insulating layer 495. The lower light blocking layer 430 may include a plurality of openings. For example, the lower light blocking layer 430 may have a plate shape including a plurality of openings.

The openings of the lower light blocking layer 430 may correspond to the openings of the upper light blocking layer 420 and the sub-pixel areas 30, respectively. In addition, the openings of the lower light blocking layer 430 located in the opening area 11 of the first color filter 513 may overlap the first openings 513a and the second openings 513b, and the openings of the lower light blocking layer 430 located in the light transmission area 12 of the first color filter 513 may overlap the first color filter 513 functioning as a color filter. In an exemplary embodiment of the present invention, the openings of the lower light blocking layer 430, the first to third lower electrodes 290_1, 290_2, and 290_3, and the optical filters 530 may respectively overlap each other. For example, the openings of the lower light blocking layer 430, the first to third lower electrodes 290_1, 290_2, and 290_3, and the first quantum dot pattern 531, the second quantum dot pattern 533 and the scattering pattern 532 of the optical filter 530 may respectively overlap each other. In addition, the lower light blocking layer 430 and the upper light blocking layer 420 may overlap the pixel defining layer 310.

The lower light blocking layer 430 may prevent a color mixture phenomenon that may occur in adjacent optical filters 530. For example, when the lower light blocking layer 430 is not formed, a portion of light incident on the second quantum dot pattern 533 may be incident on the first quantum dot pattern 531, and the remaining portion of the light may be incident on the scattering pattern 532. In this case, the color mixture phenomenon may occur. In an exemplary embodiment of the present invention, the lower light blocking layer 430 may block or absorb the light incident from the outside, and may reflect the light emitted from the light emitting layer 330. The lower light blocking layer 430 and the upper light blocking layer 420 may include substantially the same material. For example, the lower light blocking layer 430 may include an organic material and a light blocking material.

The intermediate layer 497 may be disposed on the lower light blocking layer 430 and the second protective insulating layer 495. The intermediate layer 497 may be disposed under the lower light blocking layer 430 and the second protective insulating layer 495. The intermediate layer 497 may be disposed on the bottom surface of the second protective insulating layer 495 to cover the lower light blocking layer 430. For example, the intermediate layer 497 may have a relatively thick thickness to sufficiently cover the lower light blocking layer 430 on the bottom surface of the second protective insulating layer 495. In other words, the intermediate layer 497 may be disposed on the thin film encapsulation structure 450. The intermediate layer 497 may include an organic material, an inorganic material, or the like.

The sealing member 390 may be disposed in the peripheral area 20 between the lower substrate 110 and the upper substrate 410. For example, the sealing member 390 may at least partially surround the display area 10. For example, the sealing member 390 may have a trapezoidal shape. However, the present invention is not limited thereto; for example, the sealing member 390 may have a rectangular shape. In addition, the sealing member 390 may make contact with the bottom surface of the upper substrate 410 and the top surface of the lower substrate 110. In an exemplary embodiment of the present invention, at least one insulating layer (e.g., the gate insulating layer 150, the insulating interlayer 190, and the first thin film encapsulation layer 451, and the third thin film encapsulation layer 453, etc.) may be interposed between the bottom surface of the sealing member 390 and the top surface of the lower substrate 110.

In an exemplary embodiment of the present invention, the sealing member 390 may include a non-conductive material. For example, the sealing member 390 may include a frit, etc. In addition, the sealing member 390 may further include a photocurable material. For example, the sealing member 390 may include a mixture of an organic material and a photocurable material, and the sealing member 390 may be obtained by irradiating and curing the mixture with ultraviolet (UV) light, laser light, visible light, etc. The photocurable material included in the sealing member 390 may include an epoxy acrylate-based resin, a polyester acrylate-based resin, a urethane acrylate-based resin, a polybutadiene acrylate-based resin, a silicone acrylate-based resin, an alkyl acrylate-based resin, etc.

For example, the laser light may be irradiated to the mixture of the organic material and the photocurable material. As the laser light is irradiated, the mixture may be changed from a solid state to a liquid state, and the mixture in the liquid state may be cured back to the solid state after a predetermined time. According to a state change of the mixture, the upper substrate 410 may be sealed and coupled to the lower substrate 110.

Although the sealing member 390 has been described as having a trapezoidal shape in which the top surface has a smaller width than the bottom surface, the configuration of the present invention is not limited thereto. For example, the sealing member 390 may have an inverted trapezoidal shape in which the top surface has a larger width than the bottom surface, a rectangular shape, a square shape, etc.

Although the display device 100 of the present invention has been described as being an organic light emitting diode display device, the configuration of the present invention is not limited thereto. In an exemplary embodiment of the present invention, the display device 100 may include a liquid crystal display device (LCD), a field emission display device (FED), a plasma display device (PDP), and an electrophoretic image display device (EPD). For example, the upper substrate 410 on which the optical filters 530, the color filters 510, and the like are disposed may be used as an upper substrate of each of the LCD, the FED, the PDP, and the EPD.

Figure 4:
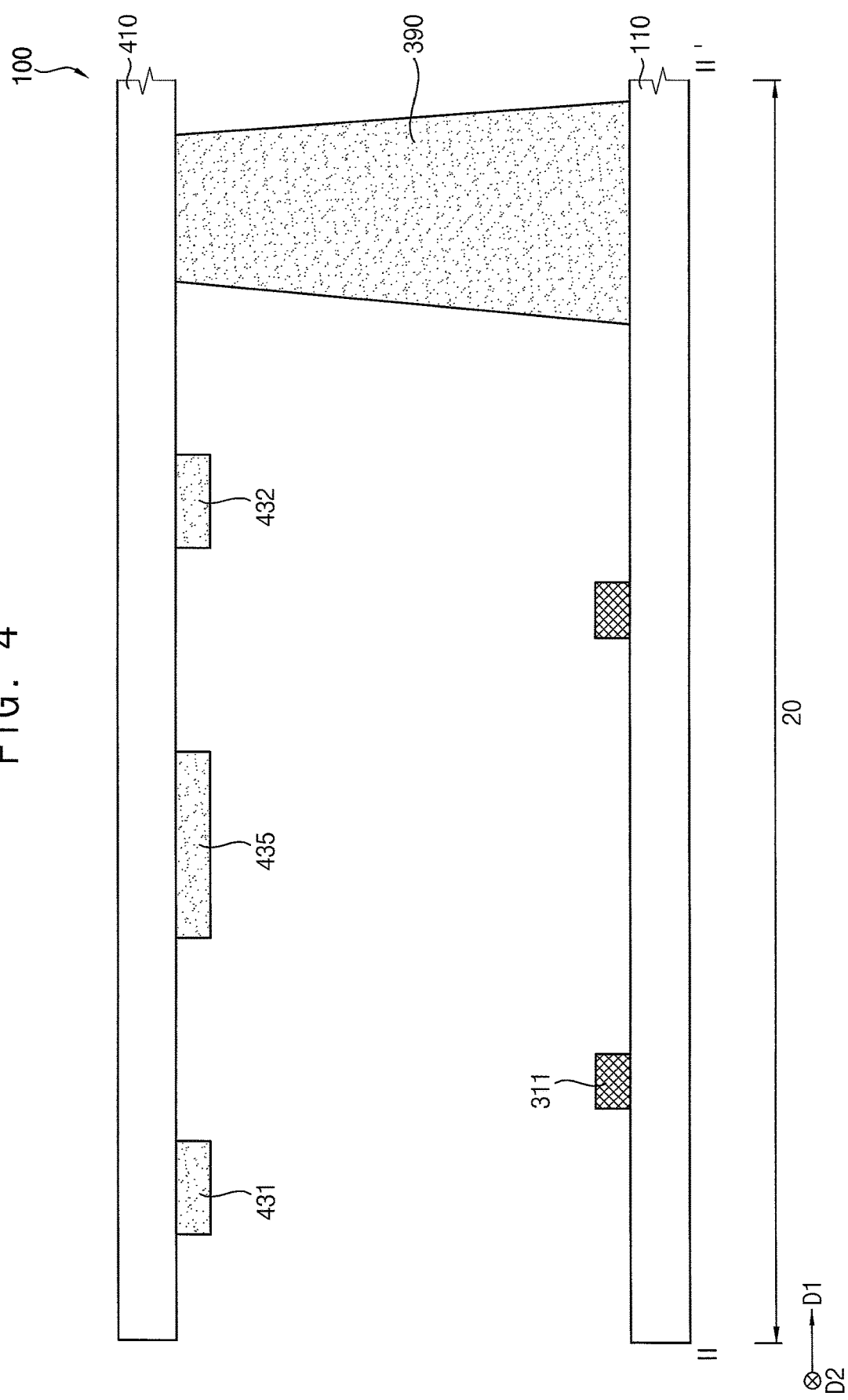
FIG. 4 is a sectional view taken along line II-II' of FIG. 2.
Figure 5:
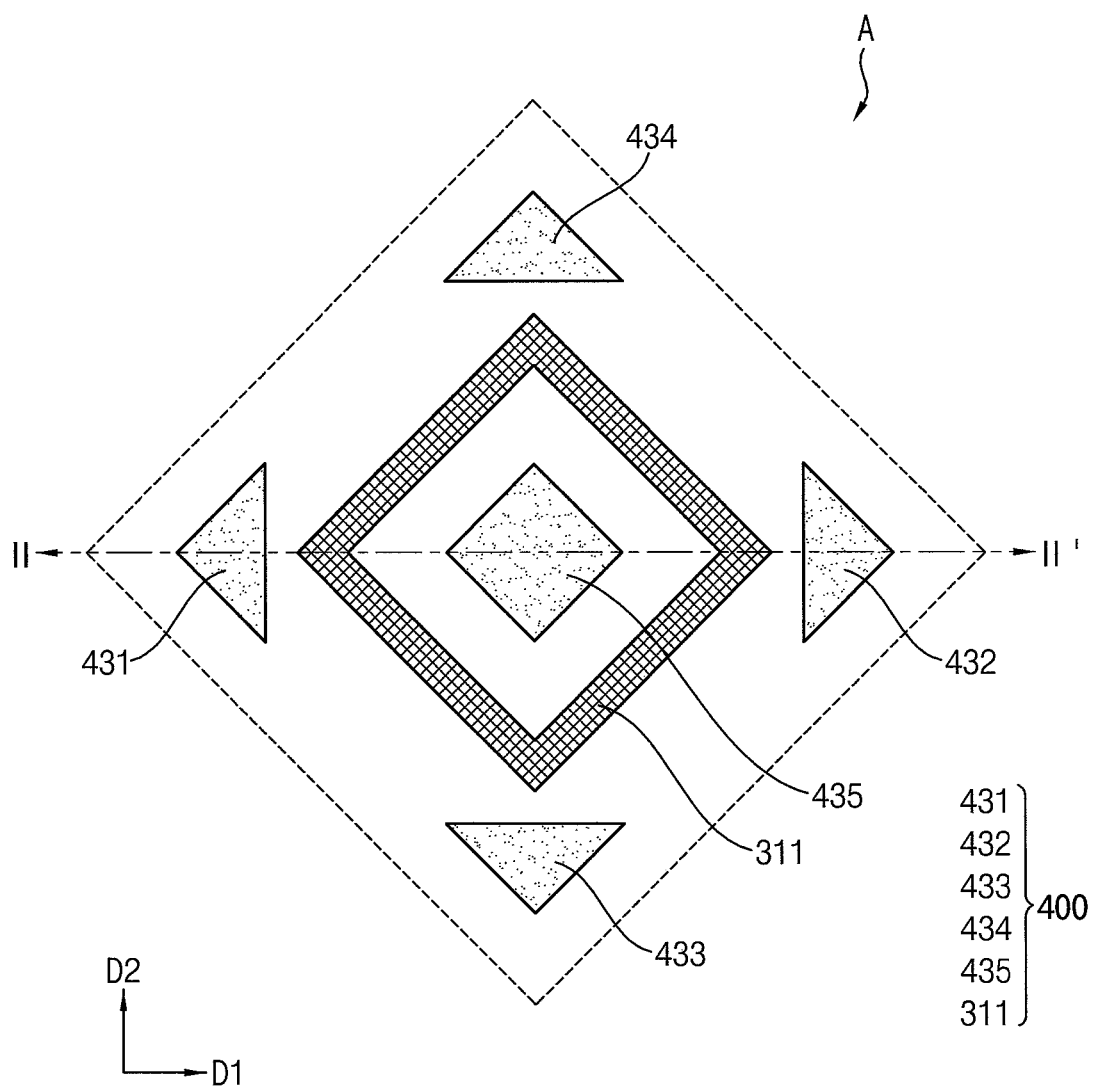
FIG. 5 is a partially enlarged plan view showing region 'A' of FIG. 1.

FIG. 4 is a sectional view taken along line II-II' of FIG. 2, and FIG. 5 is a partially enlarged plan view showing region 'A' of FIG. 1. For example, II-II' line of FIG. 2 may cross region 'A' of FIG. 1 in the first direction D1. In other words, FIG. 4 may correspond to a sectional view taken along line II-II' of FIG. 5.

Referring to FIGS. 3, 4, and 5, the display device 100 may further include an alignment structure 400. In this case, the alignment structure 400 may include a first alignment pattern and a second alignment pattern. In addition, the first alignment pattern may include a reference pattern 435, a first outer peripheral pattern 431, a second outer peripheral pattern 432, a third outer peripheral pattern 433, and a fourth outer peripheral pattern 434. Further, the second alignment pattern may include a first pattern 311.

The alignment structure 400 may be disposed in the peripheral area 20 of the lower substrate 110 and the upper substrate 410, and may contain the same material as a material forming the pixel defining layer 310 and the lower light blocking layer 430. The first alignment pattern may be disposed in the peripheral area 20 and on the bottom surface of the upper substrate 410, and the second alignment pattern may be disposed in the peripheral area 20 and on the top surface of the lower substrate 110. In this case, the first alignment pattern may contain the same material as the lower light blocking layer 430, and the second alignment pattern may include the same material as the pixel defining layer 310.

The reference pattern 435 may be disposed in a first portion of the peripheral area 20 and on the bottom surface of the upper substrate 410. In other words, the reference pattern 435 may be located at a central portion of the alignment structure 400. For example, the reference pattern 435 may have a rectangular shape having first to fourth corners when viewed in a plan view. However, the present invention is not limited thereto. For example, the reference pattern 435 may have a polygonal shape.

In the plan view of the display device 100, the first to fourth outer peripheral patterns 431, 432, 433, and 434 may be spaced apart from the reference pattern 435, and may surround the reference pattern 435. In this case, each of the first to fourth outer peripheral patterns 431, 432, 433, and 434 may be spaced apart from each other at equidistance. In addition, each of the first to fourth outer peripheral patterns 431, 432, 433, and 434 may be spaced apart from the reference pattern 435 at the same interval. Furthermore, the first outer peripheral pattern 431 may face the second outer peripheral pattern 432, and the third outer peripheral pattern 433 may face the fourth outer peripheral pattern 434.

For example, the first outer peripheral pattern 431 may be spaced apart from the first corner of the reference pattern 435 by a first distance. For example, the first outer peripheral pattern 431 may have a triangular shape when viewed in a plan view, and a first side of the triangle may face the first corner. For example, the first side of the triangle facing the first corner may be oblique.

The second outer peripheral pattern 432 may be spaced apart from the second corner of the reference pattern 435 by the first distance. For example, the second outer peripheral pattern 432 may have a triangular shape when viewed in a plan view, and an oblique side of the triangle may face the second corner.

The third outer peripheral pattern 433 may be spaced apart from the third corner of the reference pattern 435 by the first distance. For example, the third outer peripheral pattern 433 may have a triangular shape when viewed in a plan view, and an oblique side of the triangle may face the third corner.

The fourth outer peripheral pattern 434 may be spaced apart from the fourth corner of the reference pattern 435 by the first distance. For example, the fourth outer peripheral pattern 434 may have a triangular shape when viewed in a plan view, and an oblique side of the triangle may face the fourth corner.

In the plan view of the display device 100, the first pattern 311 may be disposed between the reference pattern 435 and the first to fourth outer peripheral patterns 431, 432, 433, and 434. The first pattern 311 may have a rectangular shape including an opening when viewed in a plan view. However, the present invention is not limited thereto; for example, the first pattern 311 may have a circular shape or a polygonal shape. For example, the reference pattern 435 may be located in the opening. The first pattern 311 may surround the reference pattern 435, and may not overlap the reference pattern 435 and the first to fourth outer peripheral patterns 431, 432, 433, and 434. In an exemplary embodiment of the present invention, the reference pattern 435 may be spaced apart from an inner side surface of the first pattern 311 (e.g., an outer side of the opening). For example, the reference pattern 435 may be equidistant from each inner side surface of the first pattern 311. In addition, an outer side surface of the first pattern 311 may have first to fourth corners, and the first to fourth outer peripheral patterns 431, 432, 433, and 434 may be spaced apart from the first to fourth corners at the same interval.

For example, the oblique side of the first outer peripheral pattern 431 may be spaced apart from the first corner of the outer side surface of the first pattern 311 by a second distance to face the first corner of the outer side surface of the first pattern 311. The oblique side of the second outer peripheral pattern 432 may be spaced apart from the second corner of the outer side surface of the first pattern 311 by the second distance to face the second corner of the outer side surface of the first pattern 311. The oblique side of the third outer peripheral pattern 433 may be spaced apart from the third corner of the outer side surface of the first pattern 311 by the second distance to face the third corner of the outer side surface of the first pattern 311. The oblique side of the fourth outer peripheral pattern 434 may be spaced apart from the fourth corner of the outer side surface of the first pattern 311 by the second distance to face the fourth corner of the outer side surface of the first pattern 311.

In an exemplary embodiment of the present invention, an imaginary straight line may pass through the first corner of the reference pattern 435, the first corner of the outer side surface of the first pattern 311, a corner facing the oblique side of the first outer peripheral pattern 431, the second corner of the reference pattern 435, the second corner of the outer side surface of the first pattern 311, and a corner facing the oblique side of the second outer peripheral pattern 432. In addition, an imaginary straight line may pass through the third corner of the reference pattern 435, the third corner of the outer side surface of the first pattern 311, a corner facing the oblique side of the third outer peripheral pattern 433, the fourth corner of the reference pattern 435, the fourth corner of the outer side surface of the first pattern 311, and a corner facing the oblique side of the fourth outer peripheral pattern 434.

Accordingly, the alignment structure 400 including the reference pattern 435, the first to fourth outer peripheral patterns 431, 432, 433, and 434, and the first pattern 311 may be provided.

For example, in a process of bonding an upper substrate to a lower substrate through a sealing member during a process of manufacturing a conventional display device, a lower light blocking layer and a pixel defining layer has to be accurately aligned (or, e.g., arranged to overlap) and bonded to prevent image quality dispersion due to process variation. The conventional display device may include a first alignment pattern and a second alignment pattern. The first alignment pattern may be disposed on the bottom surface of the upper substrate, and the second alignment pattern may be disposed on the top surface of the lower substrate. The first alignment pattern may contain the same material as an upper light blocking layer, and the second alignment pattern may contain the same material as the metal layer disposed between the lower substrate and a buffer layer. In other words, the conventional display device uses the upper light blocking layer, which may be a black matrix formed on the upper substrate, as the first alignment pattern, and uses the metal layer, which is a metal formed on the lower substrate, as the second alignment pattern. When the alignment patterns are formed by using the upper light blocking layer and the metal layer, and the upper substrate and the lower substrate are bonded to each other by using the alignment patterns, the lower light blocking layer and the pixel defining layer may not be accurately aligned due to the process variation. Thus, a dispersion angle of light emitted through the color filters of the conventional display device may be slightly changed, and the image quality of the conventional display device may be reduced.

The display device 100 according to an exemplary embodiment of the present invention may include a first alignment pattern containing the same material as the lower light blocking layer 430 and a second alignment pattern containing the same material as the pixel defining layer 310. In other words, the alignment structure 400 may be formed by using the lower light blocking layer 430 and the pixel defining layer 310. When the upper substrate 410 and the lower substrate 110 are bonded to each other by using the alignment structure 400, even if process variation occurs, the lower light blocking layer 430 and the pixel defining layer 310 may be aligned in a relatively accurate manner. Accordingly, a defective rate of the display device 100 may be reduced.

Figure 6:
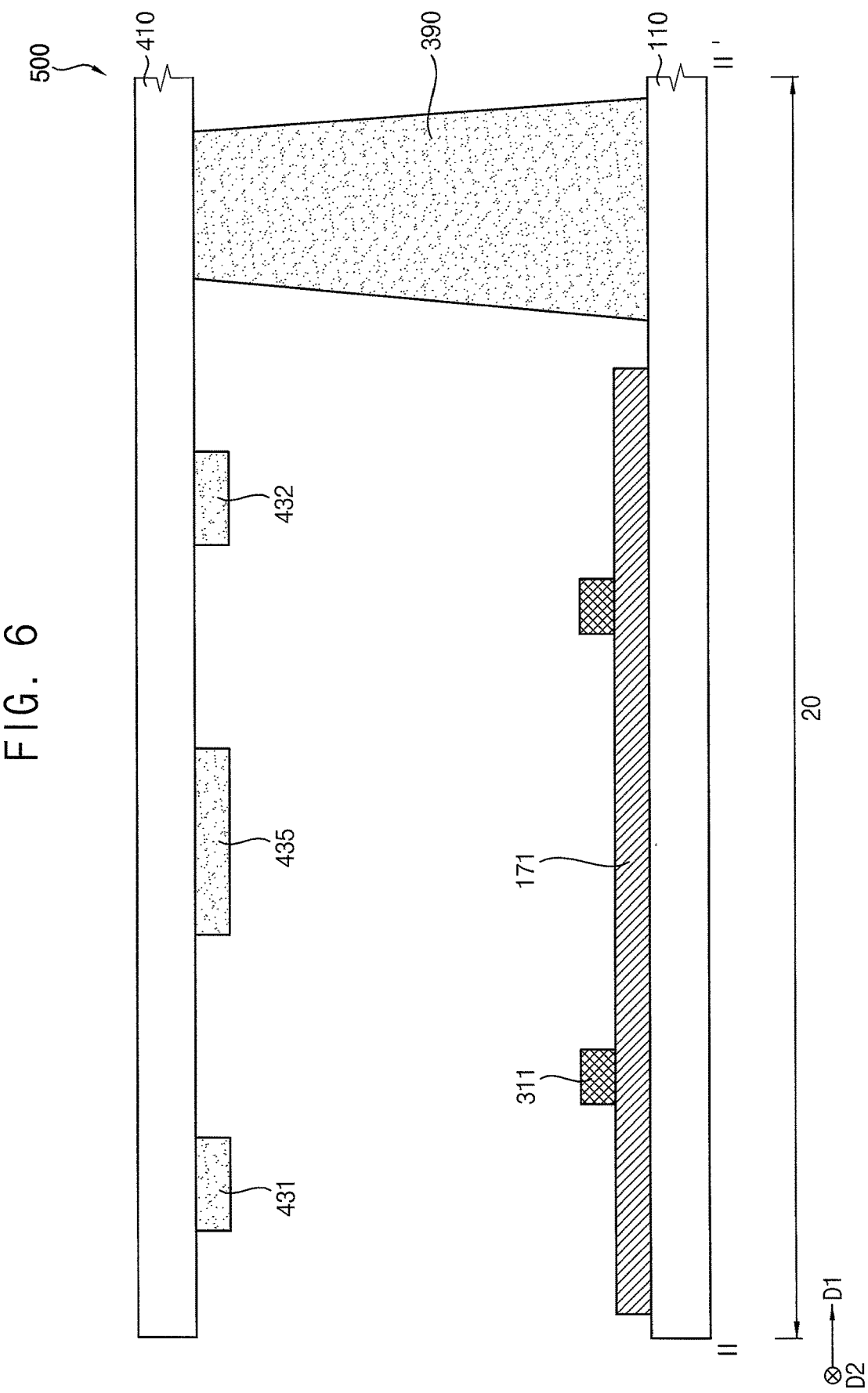
FIGS. 6 and 7 are views showing a display device according to an exemplary embodiment of the present invention.
Figure 7:
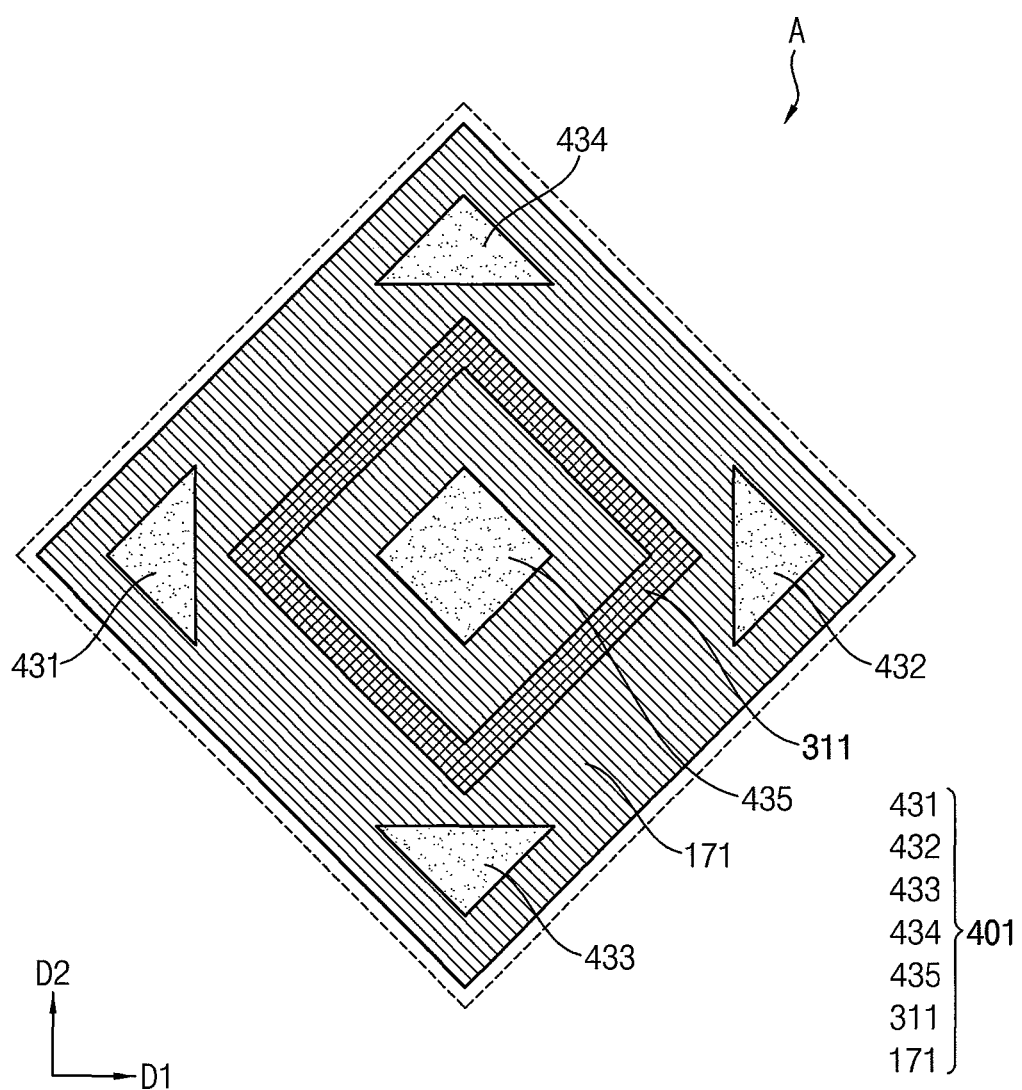

FIGS. 6 and 7 are views showing a display device according to an exemplary embodiment of the present invention. A display device 500 illustrated in FIGS. 6 and 7 may have a configuration substantially identical or similar to the configuration of the display device 100 described with reference to FIGS. 1 to 5 except for an alignment structure 401. In FIGS. 6 and 7, redundant descriptions of components substantially identical or similar to the components described with reference to FIGS. 1 to 5 may be omitted. For example, FIG. 6 may correspond to a sectional view of the display device 500 taken along line 11-Ir of FIG. 2, and FIG. 7 may correspond to a partially enlarged plan view of the display device 500 in which region 'A' of FIG. 1 is enlarged.

Referring to FIGS. 3, 6, and 7, the display device 500 may include a lower substrate 110, a first semiconductor element 250_1, a second semiconductor element 250_2, a third semiconductor element 250_3, a gate insulating layer 150, an insulating interlayer 190, a planarization layer 270, a first lower electrode 290_1, a second lower electrode 290_2, a third lower electrode 290_3, a light emitting layer 330, an upper electrode 340, a thin film encapsulation structure 450, a first protective insulating layer 490, a second protective insulating layer 495, a plurality of optical filters 530, an intermediate layer 497, a plurality of color filters 510, an upper light blocking layer 420, a lower light blocking layer 430, a sealing member 390, an upper substrate 410, alignment structure 401, etc. In this case, the alignment structure 401 may include a first alignment pattern and a second alignment pattern. In addition, the first alignment pattern may include a reference pattern 435, a first outer peripheral pattern 431, a second outer peripheral pattern 432, a third outer peripheral pattern 433, and a fourth outer peripheral pattern 434. Further, the second alignment pattern may include a first pattern 311 and a second pattern 171.

The alignment structure 401 may be disposed in the peripheral area 20 of the lower substrate 110 and the upper substrate 410, and may contain the same material as a material forming the pixel defining layer 310 and the lower light blocking layer 430, and a metal material. The first alignment pattern may be disposed in the peripheral area 20 on the bottom surface of the upper substrate 410, and the second alignment pattern may be disposed in the peripheral area 20 on the top surface of the lower substrate 110. In this case, the first alignment pattern may contain the same material as the lower light blocking layer 430. In addition, the second alignment pattern may include the same material as the pixel defining layer 310, the metal layer disposed between the lower substrate 110 and the buffer layer, and the same material as one of the first to third gate electrodes 170_1, 170_2, and 170_3, the first to third source electrodes 210_1, 210_2, and 210_3, the first to third drain electrodes 230_1, 230_2, and 230_3, and/or the first to third lower electrodes 290_1, 290_2, and 290_3.

As shown in FIG. 6, the second pattern 171 may be disposed between the first pattern 311 and the lower substrate 110. As shown in FIG. 7, the second pattern 171 may overlap the reference pattern 435, the first to fourth outer peripheral patterns 431, 432, 433, and 434, and the first pattern 311.

In the plan view of the display device 500, the second pattern 171 may have a rectangular shape when viewed in a plan view, and may extend beyond the first to fourth outer peripheral patterns 431, 432, 433, and 434. For example, the second pattern 171 may extend beyond the outer peripheries of the first to fourth outer peripheral patterns 431, 432, 433, and 434.

Accordingly, the alignment structure 401 including the reference pattern 435, the first to fourth outer peripheral patterns 431, 432, 433, and 434, the first pattern 311, and the second pattern 171 may be provided.

In the process of bonding the upper substrate 410 to the lower substrate 110 through the sealing member 390, the bonding process may proceed while checking the alignment structure 401 through a camera. When the upper substrate 410 and the lower substrate 110 are bonded to each other by using the alignment structure 401, the camera may recognize the alignment structure 401 in a relatively easy manner due to the second pattern 171.

Since the display device 500 according to an exemplary embodiment of the present invention includes the alignment structure 401 including the reference pattern 435, the first to fourth outer peripheral patterns 431, 432, 433, and 434, the first pattern 311, and the second pattern 171, a recognition rate of the camera may be increased in the bonding process.

Figure 8:
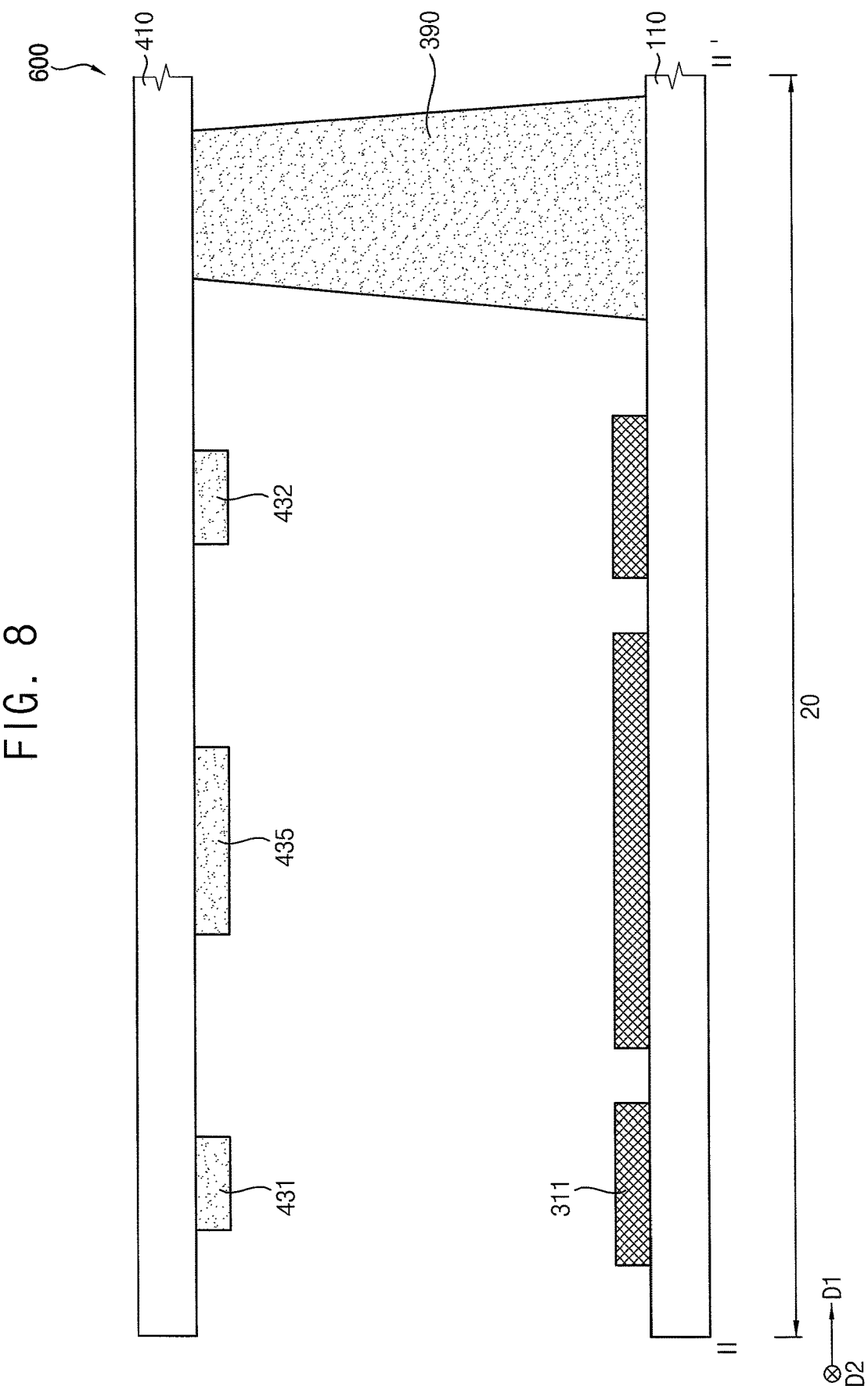
FIGS. 8 and 9 are views showing a display device according to an exemplary embodiment of the present invention.
Figure 9:
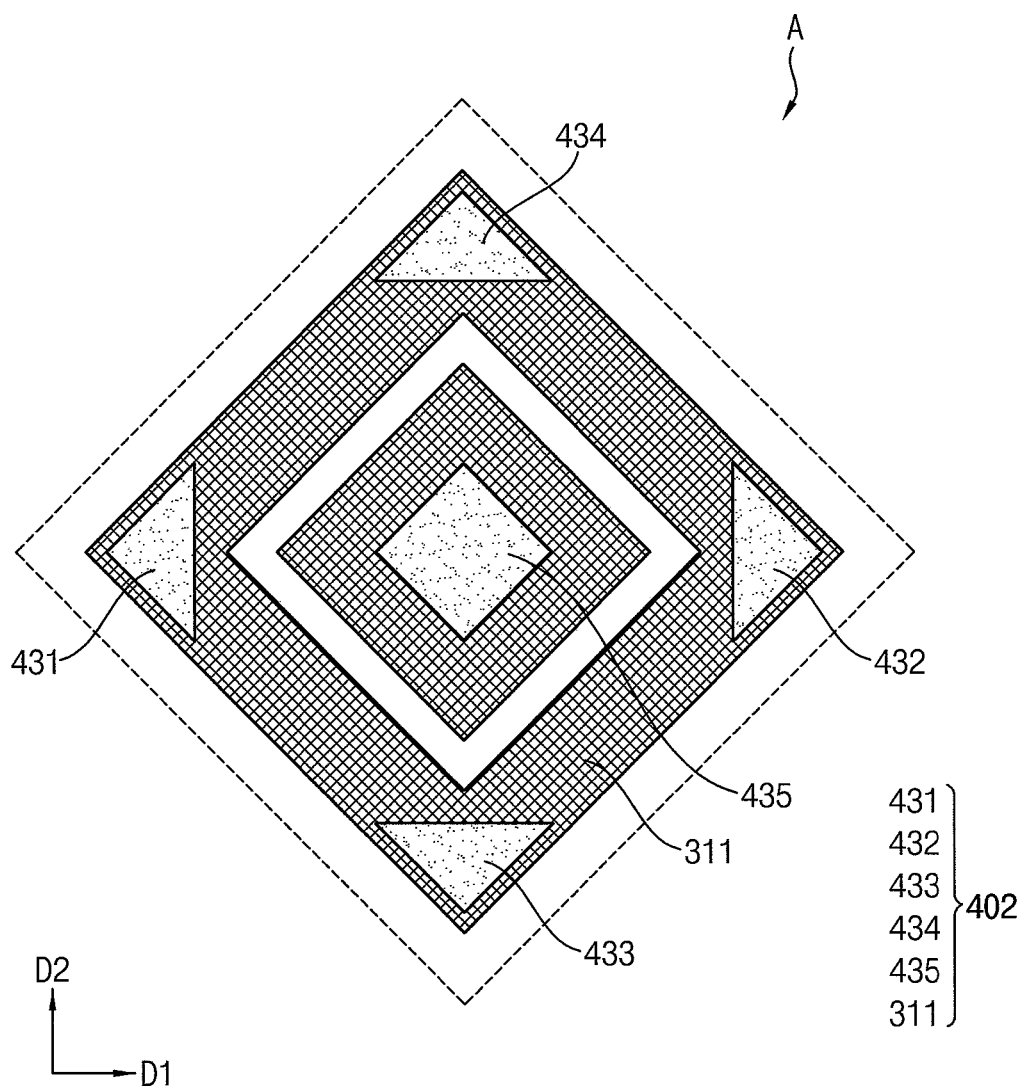

FIGS. 8 and 9 are views showing a display device according to an exemplary embodiment of the present invention. A display device 600 illustrated in FIGS. 6 and 7 may have a configuration substantially identical or similar to the configuration of the display device 100 described with reference to FIGS. 1 to 5 except for an alignment structure 402. In FIGS. 8 and 9, redundant descriptions of components substantially identical or similar to the components described with reference to FIGS. 1 to 5 may be omitted. For example, FIG. 8 may correspond to a sectional view of the display device 600 taken along line of FIG. 2, and FIG. 9 may correspond to a partially enlarged plan view of the display device 600 in which region 'A' of FIG. 1 is enlarged.

Referring to FIGS. 3, 8, and 9, the display device 600 may include a lower substrate 110, a first semiconductor element 250_1, a second semiconductor element 250_2, a third semiconductor element 250_3, a gate insulating layer 150, an insulating interlayer 190, a planarization layer 270, a first lower electrode 290_1, a second lower electrode 290_2, a third lower electrode 290_3, a light emitting layer 330, an upper electrode 340, a thin film encapsulation structure 450, a first protective insulating layer 490, a second protective insulating layer 495, a plurality of optical filters 530, an intermediate layer 497, a plurality of color filters 510, an upper light blocking layer 420, a lower light blocking layer 430, a sealing member 390, an upper substrate 410, alignment structure 402, etc. In this case, the alignment structure 402 may include a first alignment pattern and a second alignment pattern. In addition, the first alignment pattern may include a reference pattern 435, a first outer peripheral pattern 431, a second outer peripheral pattern 432, a third outer peripheral pattern 433, and a fourth outer peripheral pattern 434. The second alignment pattern may include a first pattern 311.

When compared with the first alignment pattern and the second alignment pattern of the alignment structure 400 in FIGS. 4 and 5, the first alignment pattern of the alignment structure 402 in FIGS. 8 and 9 may be the same as the first alignment pattern of the alignment structure 400, and a shape of the first pattern 311 of the second alignment pattern of the alignment structure 402 may be different from the shape of the first pattern 311 of the second alignment pattern of the alignment structure 400. For example, the first pattern 311 of the alignment structure 400 may have a smaller width in the first direction D1 than that of the first pattern 311 of the alignment structure 402. In addition, the first pattern 311 of the alignment structure 402 may overlap the first to fourth outer peripheral patterns 431-434 and the reference pattern 435. Further, the first pattern 311 of the alignment structure 402 may include an opening surrounding the reference pattern 435.

Figure 10:
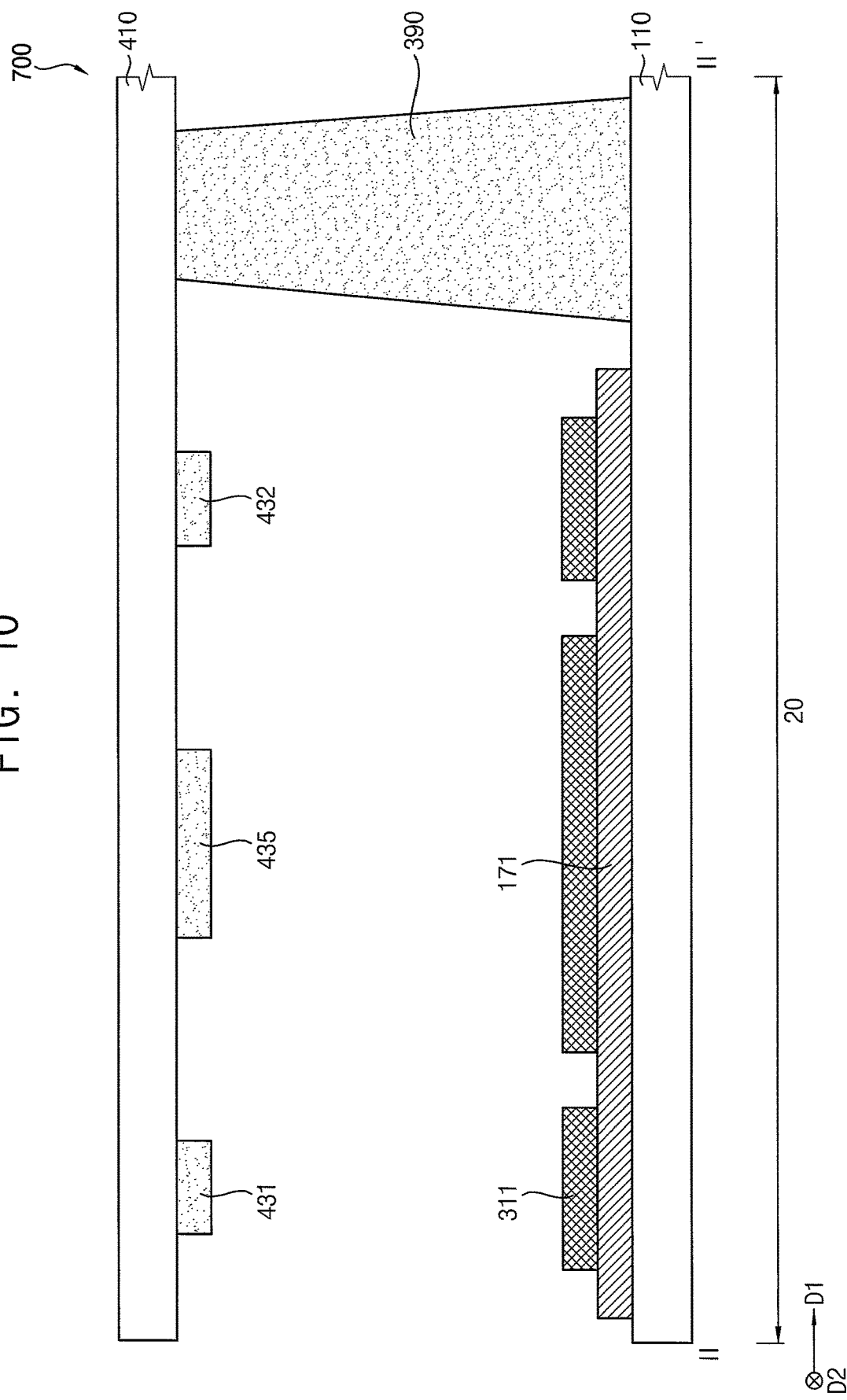
FIGS. 10 and 11 are views showing a display device according to an exemplary embodiment of the present invention.
Figure 11:
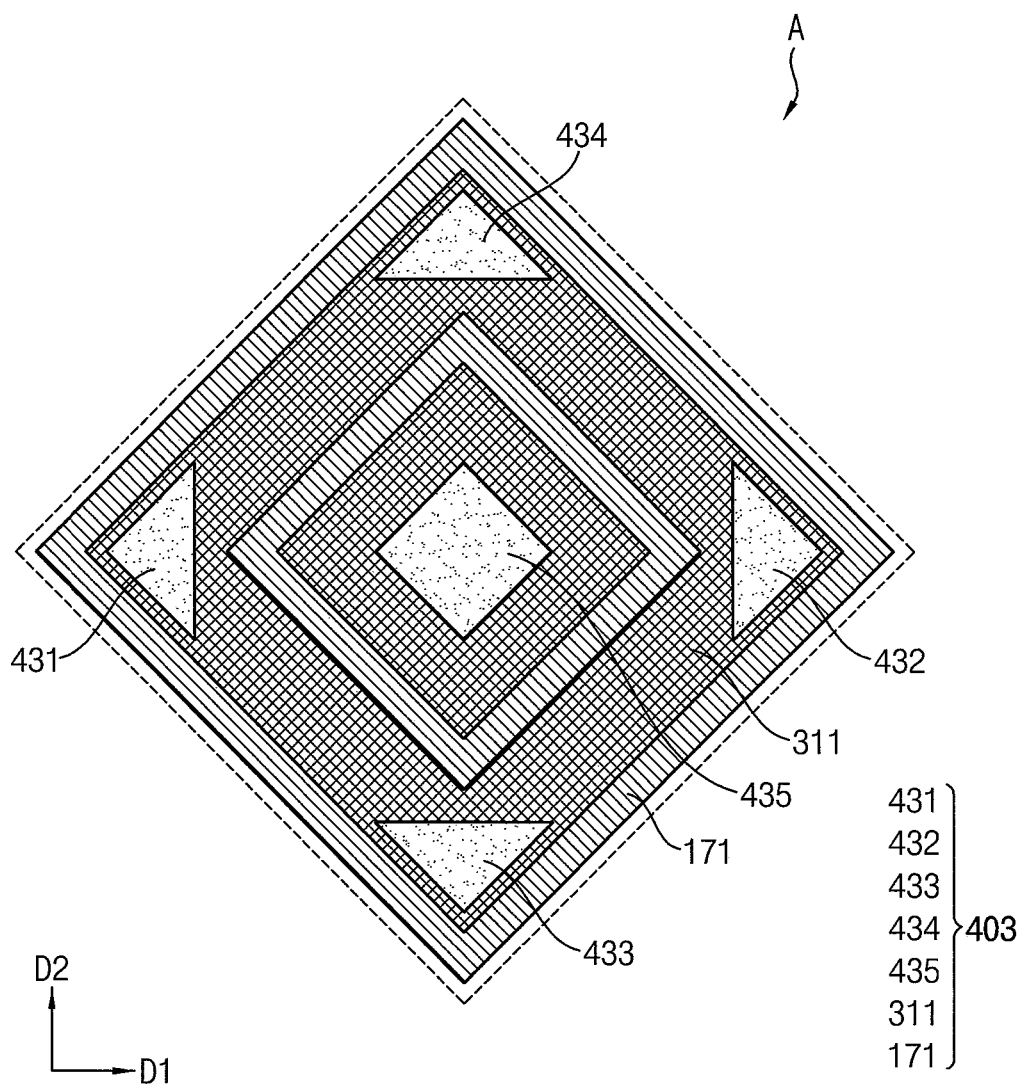

FIGS. 10 and 11 are views showing a display device according to an exemplary embodiment of the present invention. A display device 700 illustrated in FIGS. 10 and 11 may have a configuration substantially identical or similar to the configuration of the display device 500 described with reference to FIGS. 6 and 7 except for an alignment structure 403. In FIGS. 10 and 11, redundant descriptions of components substantially identical or similar to the components described with reference to FIGS. 6 and 7 may be omitted. For example, FIG. 10 may correspond to a sectional view of the display device 700 taken along line II-II' of FIG. 2, and FIG. 11 may correspond to a partially enlarged plan view of the display device 700 in which region 'A' of FIG. 1 is enlarged.

Referring to FIGS. 3, 10, and 11, the display device 700 may include a lower substrate 110, a first semiconductor element 250_1, a second semiconductor element 250_2, a third semiconductor element 250_3, a gate insulating layer 150, an insulating interlayer 190, a planarization layer 270, a first lower electrode 290_1, a second lower electrode 290_2, a third lower electrode 290_3, a light emitting layer 330, an upper electrode 340, a thin film encapsulation structure 450, a first protective insulating layer 490, a second protective insulating layer 495, a plurality of optical filters 530, an intermediate layer 497, a plurality of color filters 510, an upper light blocking layer 420, a lower light blocking layer 430, a sealing member 390, an upper substrate 410, alignment structure 403, etc. In this case, the alignment structure 403 may include a first alignment pattern and a second alignment pattern. In addition, the first alignment pattern may include a reference pattern 435, a first outer peripheral pattern 431, a second outer peripheral pattern 432, a third outer peripheral pattern 433, and a fourth outer peripheral pattern 434. The second alignment pattern may include a first pattern 311 and a second pattern 171.

When compared with the first alignment pattern and the second alignment pattern of the alignment structure 401 in FIGS. 6 and 7, the first alignment pattern of the alignment structure 403 in FIGS. 10 and 11 may be the same as the first alignment pattern of the alignment structure 401, and a shape of the first pattern 311 of the second alignment pattern of the alignment structure 403 may be different from the shape of the first pattern 311 of the second alignment pattern of the alignment structure 401. For example, the first pattern 311 of the alignment structure 401 may have a smaller width in the first direction D1 than that of the first pattern 311 of the alignment structure 403. In addition, the first pattern 311 of the alignment structure 403 may overlap the first to fourth outer peripheral patterns 431-434 and the reference pattern 435 while disposed on the second pattern 171.

FIGS. 12 to 23 are sectional views showing a method of manufacturing a display device according to an exemplary embodiment of the present invention.

Figure 12:
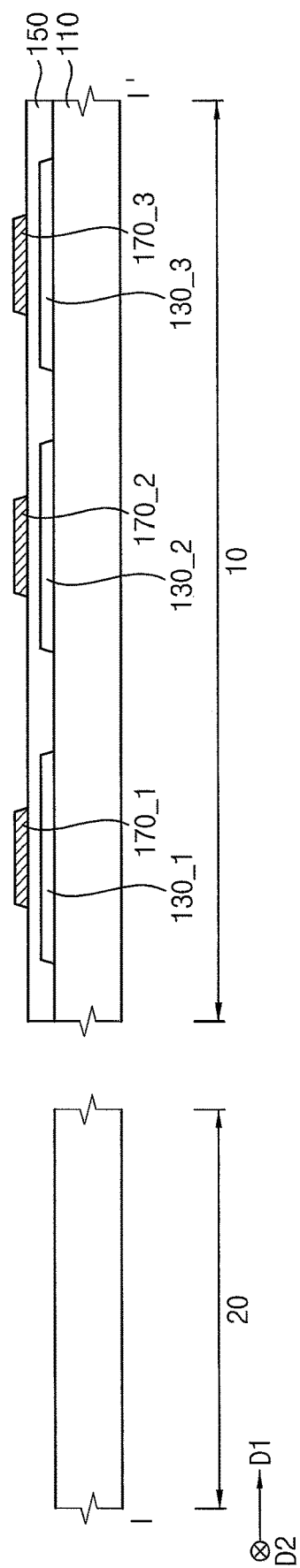
FIGS. 12, 13, 14, 15, 16, 17, 18, 19, 20, 21, 22, and 23 are sectional views showing a method of manufacturing a display device according to an exemplary embodiment of the present invention.
Figure 13:
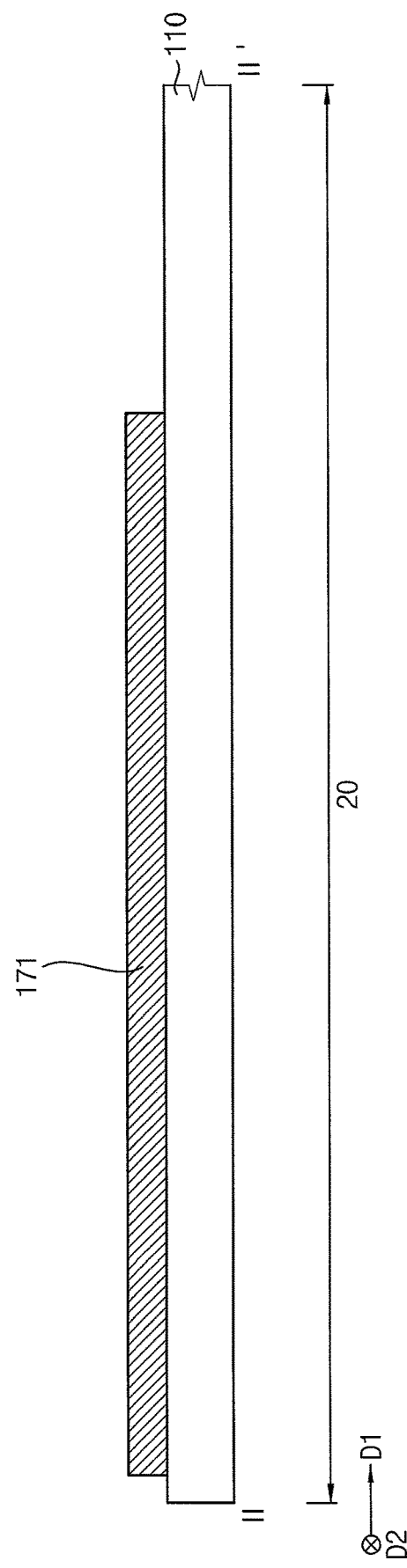

Referring to FIGS. 12 and 13, a lower substrate 110 including a transparent or opaque material may be provided. The lower substrate 110 may be divided into the display area 10 and the peripheral area 20. The lower substrate 110 may be formed by using, for example, a quartz substrate, a synthetic quartz substrate, a calcium fluoride substrate, a fluorine-doped quartz substrate, a soda lime glass substrate, a non-alkali glass substrate, etc.

In an exemplary embodiment of the present invention, the lower substrate 110 may be formed of a transparent resin substrate having flexibility. Examples of the transparent resin substrate that may be used as the lower substrate 110 include a polyimide substrate. In this case, the polyimide substrate may include a first polyimide layer, a barrier film layer, a second polyimide layer, etc. For example, the polyimide substrate may have a configuration in which the first polyimide layer, the barrier film layer, and the second polyimide layer are sequentially stacked on a rigid glass substrate. In the method of manufacturing the display device, after an insulating layer (e.g., the buffer layer) may be formed on the second polyimide layer of the polyimide substrate, an upper structure (e.g., the semiconductor elements, the sub-pixel structures, etc.) may be formed on the insulating layer. After the upper structure is formed, the rigid glass substrate may be removed. In other words, since the polyimide substrate is thin and flexible, it may be difficult to directly form the upper structure on the polyimide substrate. In this regard, after the upper structure is formed by using the rigid glass substrate, the glass substrate is removed, so that the polyimide substrate may be used as the lower substrate 110.

The buffer layer may be formed in the display area 10 on the lower substrate 110. The buffer layer may be formed over the lower substrate 110. Depending on a type of the lower substrate 110, at least two buffer layers may be provided on the lower substrate 110, or the buffer layer may not be provided. For example, the buffer layer may be formed by using an organic material or an inorganic material.

The metal layer may be formed between the lower substrate 110 and the buffer layer. In an exemplary embodiment of the present invention, when the lower substrate 110 includes a polyimide substrate, the metal layer may be formed between the first polyimide layer and the barrier film layer or between the barrier film layer and the second polyimide layer. The metal layer may be formed by using, for example, a metal, an alloy, metal nitride, conductive metal oxide, a transparent conductive material, etc. These may be used alone or in combination with each other.

The first to third active layers 130_1, 130_2, and 130_3 may be spaced apart from each other in the display area 10 on the lower substrate 110. Each of the first to third active layers 130_1, 130_2, and 130_3 may be formed by using, for example, an oxide semiconductor, an inorganic semiconductor, an organic semiconductor, or the like, and may include a source region and a drain region. In other words, the first to third active layers 130_1, 130_2, and 130_3 may be simultaneously formed by using the same material.

The gate insulating layer 150 may be formed on the first to third active layers 130_1, 130_2, and 130_3. The gate insulating layer 150 may cover the first to third active layers 130_1, 130_2, and 130_3 in the display area 10 on the lower substrate 110, and may be formed over the lower substrate 110. In an exemplary embodiment of the present invention, the gate insulating layer 150 may be formed in the peripheral area 20 and on the lower substrate 110.

For example, the gate insulating layer 150 may sufficiently cover the first to third active layers 130_1, 130_2, and 130_3 on the lower substrate 110, and may have a substantially flat top surface without creating a step around the first to third active layers 130_1, 130_2, and 130_3. In an exemplary embodiment of the present invention, the gate insulating layer 150 may be formed along a profile of the first to third active layers 130_1, 130_2, and 130_3 with a substantially uniform thickness to cover the first to third active layers 130_1, 1302, and 130_3 and may be formed on the lower substrate 110. The gate insulating layer 150 may be formed by using a silicon compound, metal oxide, etc. For example, the gate insulating layer 150 may include $SiO_x$, $SiO_xN_y$, $SiO_xC_y$, $SiC_xN_y$, $AlO_x$, $AlN_x$, $TaO_x$, $HfO_x$, $ZrO_x$, $TiO_x$, etc.

The first to third gate electrodes 170_1, 170_2, and 170_3 may be spaced apart from each other on the gate insulating layer 150. For example, the first gate electrode 170_1 may be formed at a portion of the gate insulating layer 150 under which the first active layer 130_1 is located, the second gate electrode 170_2 may be formed at a portion of the gate insulating layer 150 under which the second active layer 130_2 is located, and the third gate electrode 170_3 may be formed at a portion of the gate insulating layer 150 under which the third active layer 130_3 is located. Each of the first to third gate electrodes 170_1, 170_2, and 170_3 may be formed by using a metal, an alloy, metal nitride, conductive metal oxide, a transparent conductive material, etc. For example, each of the first to third gate electrodes 170_1, 170_2, and 170_3 may include Au, Ag, Al, Pt, Ni, Ti, Pd, Mg, Ca, Li, Cr, Ta, W, Cu, Mo, Sc, Nd, Ir, an aluminum-containing alloy, $AlN_x$, a silver-containing alloy, $WN_x$, a copper-containing alloy, a molybdenum-containing alloy, $TiN_x$, $CrN_x$, $TaN_x$, $SrRu_xO_y$, $ZnO_x$, ITO, $SnO_x$, $InO_x$, $GaO_x$, IZO, etc. These may be used alone or in combination with each other.

As shown in FIG. 13, the second pattern 171 may be formed in the peripheral area 20 and on the lower substrate 110. In an exemplary embodiment of the present invention, the second pattern 171 may be simultaneously formed with the first to third gate electrodes 170_1, 170_2, and 170_3 by using the same material as the first to third gate electrodes 170_1, 170_2, and 170_3.

Figure 14:
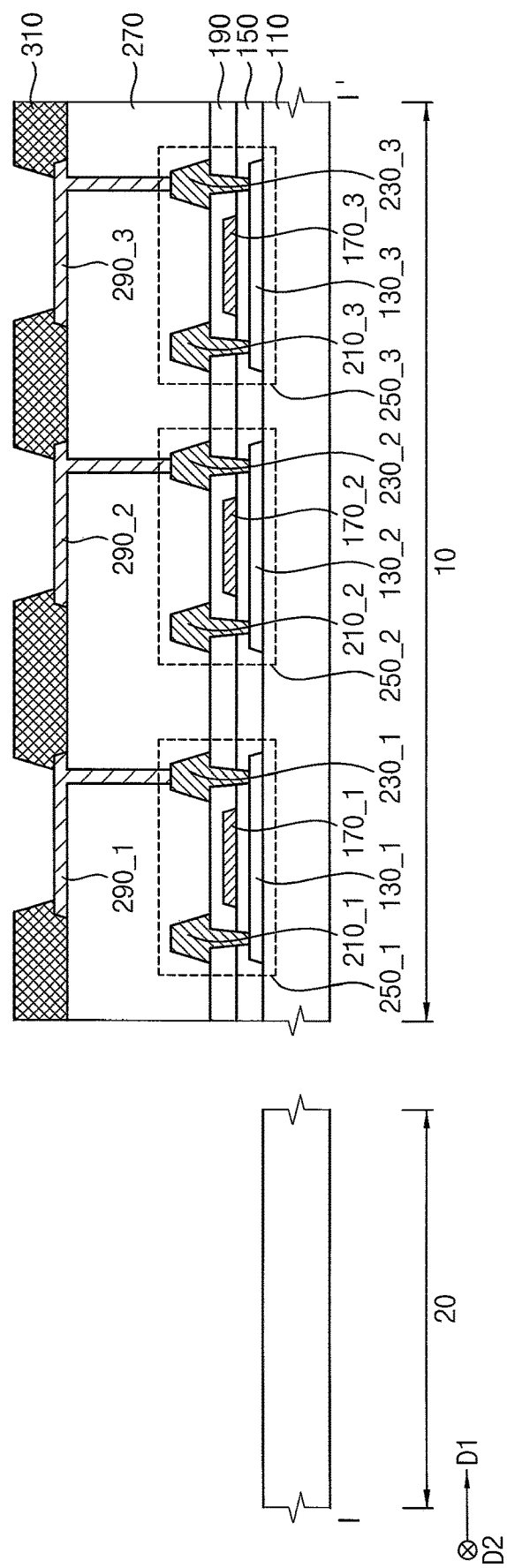
Figure 15:
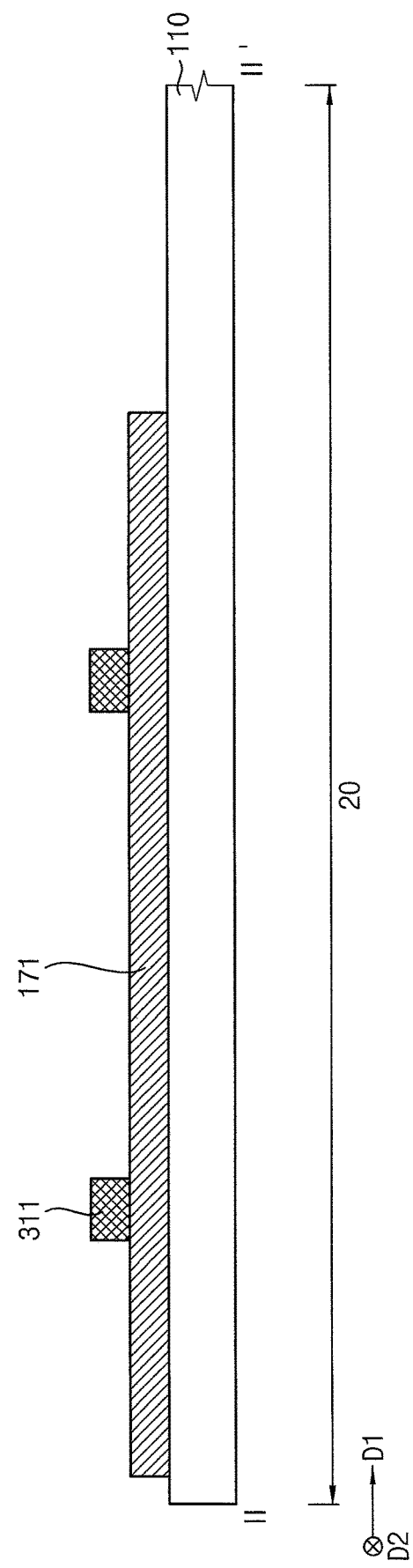

Referring to FIGS. 14 and 15, the insulating interlayer 190 may be formed on the first to third gate electrodes 170_1, 170_2, and 170_3. The insulating interlayer 190 may cover the first to third gate electrodes 170_1, 170_2, and 170_3 in the display area 10 and on the gate insulating layer 150, and may be formed over the gate insulating layer 150. In an exemplary embodiment of the present invention, the insulating interlayer 190 may be formed in the peripheral area 20 and on the lower substrate 110.

For example, the insulating interlayer 190 may sufficiently cover the first to third gate electrodes 170_1, 170_2, and 170_3 on the gate insulating layer 150, and may have a substantially flat top surface without creating a step around the first to third gate electrodes 170_1, 170_2, and 170_3. In an exemplary embodiment of the present invention, the insulating interlayer 190 may be formed along a profile of the first to third gate electrodes 170_1, 170_2, and 170_3 with a substantially uniform thickness to cover the first to third gate electrodes 170_1, 170_2, and 170_3 on the gate insulating layer 150. The insulating interlayer 190 may be formed by using, for example, a silicon compound, metal oxide, etc.

The first source electrode 210_1, the first drain electrode 230_1, the second source electrode 210_2, the second drain electrode 230_2, and the third source electrode 210_3, and the third drain electrode 230_3 may be spaced apart from each other in the display area 10 on the insulating interlayer 190. For example, the first source electrode 210_1 may be connected to the source region of the first active layer 130_1 through a contact hole formed by removing first portions of the gate insulating layer 150 and the insulating interlayer 190, and the first drain electrode 230_1 may be connected to the drain region of the first active layer 130_1 through a contact hole formed by removing second portions of the gate insulating layer 150 and the insulating interlayer 190. In addition, the second source electrode 210_2 may be connected to the source region of the second active layer 130_2 through a contact hole formed by removing third portions of the gate insulating layer 150 and the insulating interlayer 190, and the second drain electrode 230_2 may be connected to the drain region of the second active layer 130_2 through a contact hole formed by removing fourth portions of the gate insulating layer 150 and the insulating interlayer 190. Furthermore, the third source electrode 210_3 may be connected to the source region of the third active layer 130_3 through a contact hole formed by removing fifth portions of the gate insulating layer 150 and the insulating interlayer 190, and the third drain electrode 230_3 may be connected to the drain region of the third active layer 130_3 through a contact hole formed by removing sixth portions of the gate insulating layer 150 and the insulating interlayer 190. Each of the first to third source electrodes 210_1, 210_2, and 210_3 and the first to third drain electrodes 230_1, 230_2, and 230_3 may be formed by using, for example, a metal, an alloy, metal nitride, conductive metal oxide, a transparent conductive material, etc. These may be used alone or in combination with each other. In other words, the first to third source electrodes 210_1, 210_2, and 210_3 and the first to third drain electrodes 230_1, 230_2, and 230_3 may be simultaneously formed by using the same material.

Accordingly, the first semiconductor element 250_1 including the first active layer 130_1, the first gate electrode 170_1, the first source electrode 210_1, and the first drain electrode 230_1 may be formed, the second semiconductor element 250_2 including the second active layer 130_2, the second gate electrode 170_2, the second source electrode 210_2, and the second drain electrode 230_2 may be formed, and the third semiconductor element 250_3 including the third active layer 130_3, the third gate electrode 170_3, the third source electrode 210_3, and the third drain electrode 230_3 may be formed.

The planarization layer 270 may be formed in the display area 10 and on the insulating interlayer 190 and the first to third semiconductor elements 250_1, 250_2, and 250_3, and may not be formed in the peripheral area 20. For example, the planarization layer 270 may have a relatively thick thickness to sufficiently cover the first to third source electrodes 210_1, 210_2, and 2103 and the first to third drain electrodes 230_1, 230_2, and 230_3 on the insulating interlayer 190. In this case, the planarization layer 270 may have a substantially flat top surface. To implement such a flat top surface of the planarization layer 270, a planarization process may be additionally performed on the planarization layer 270. The planarization layer 270 may be formed by using an organic material.

The first to third lower electrodes 290_1, 290_2, and 2903 may be spaced apart from each other in the display area 10 on the planarization layer 270. The first to third lower electrodes 290_1, 290_2, and 290_3 may be connected to the first to third drain electrodes 230_1, 230_2, and 230_3 by passing through the planarization layer 270, respectively. Each of the first to third lower electrodes 290_1, 290_2, and 290_3 may be formed by using, for example, a metal, an alloy, metal nitride, conductive metal oxide, a transparent conductive material, etc. These may be used alone or in combination with each other. In other words, the first to third lower electrodes 290_1, 290_2, and 290_3 may be simultaneously formed by using the same material.

The pixel defining layer 310 may be formed in the display area 10 and on a portion of each of the first to third lower electrodes 290_1, 290_2, and 290_3 and the planarization layer 270, and may not be formed in the peripheral area 20. The pixel defining layer 310 may cover both sides of each of the first to third lower electrodes 290_1, 290_2, and 290_3, and may allow a portion of a top surface of each of the first to third lower electrodes 290_1, 290_2, and 290_3 to be exposed. The pixel defining layer 310 may be formed by using an organic material.

As shown in FIG. 15, the first pattern 311 may be formed on the second pattern 171. In an exemplary embodiment of the present invention, the first pattern 311 may be simultaneously formed with the pixel defining layer 310 by using the same material as the pixel defining layer 310.

Figure 16:
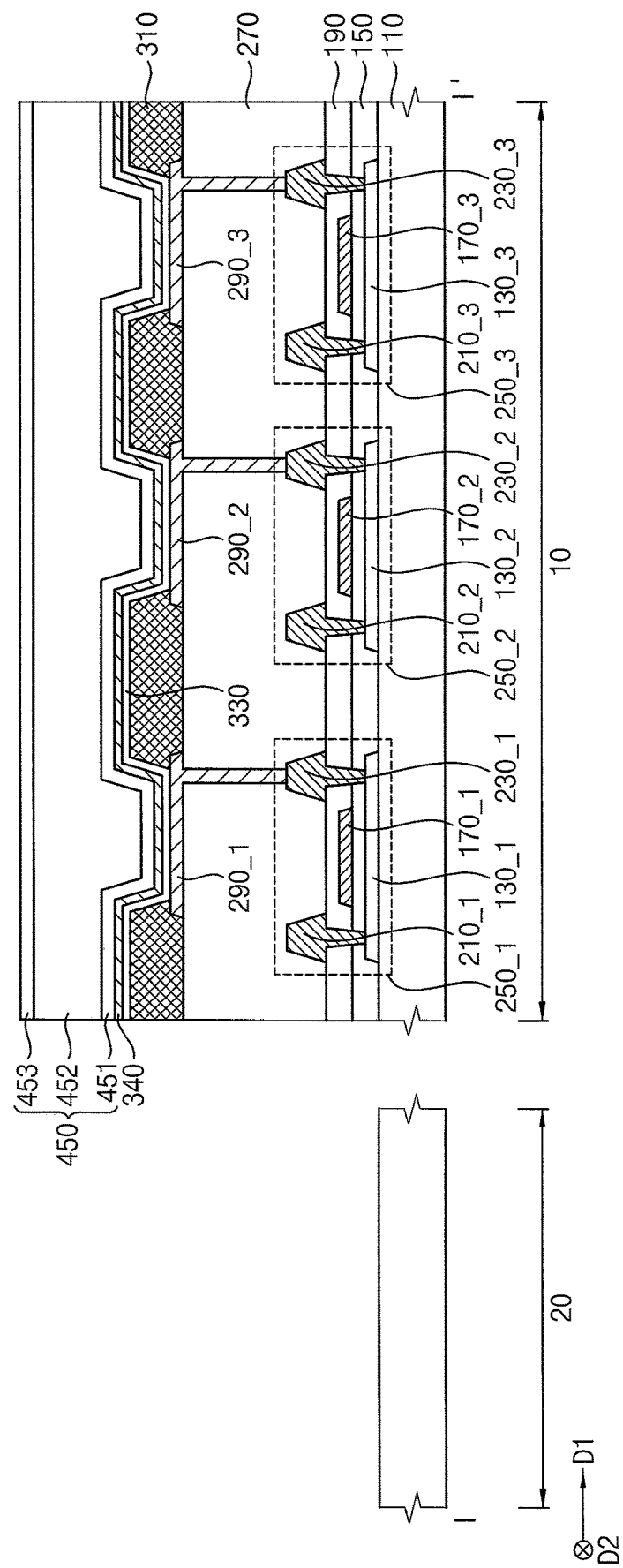

Referring to FIG. 16, the light emitting layer 330 may be formed in the display area 10 and on the top surface of each of the first to third lower electrodes 290_1, 290_2, and 290_3 exposed by the pixel defining layer 310. In other words, the light emitting layer 330 may be continuously (or, e.g., integrally) formed in the display area 10 on the lower substrate 110. In an exemplary embodiment of the present invention, the light emitting layer 330 may be formed by using a light emitting material for emitting blue light. In addition, the light emitting layer 330 may be formed by laminating a plurality of light emitting materials for emitting different color lights such as red light, green light, and blue light to emit white light as a whole.

The upper electrode 340 may be formed in the display area 10 and on the pixel defining layer 310 and the light emitting layer 330. The upper electrode 340 may be formed by using, for example, a metal, an alloy, metal nitride, conductive metal oxide, a transparent conductive material, etc. These may be used alone or in combination with each other.

Accordingly, the first sub-pixel structure including the first lower electrode 290_1, the light emitting layer 330, and the upper electrode 340 may be formed, the second sub-pixel structure including the second lower electrode 290_2, the light emitting layer 330, and the upper electrode 340 may be formed, and the third sub-pixel structure including the third lower electrode 290_3, the light emitting layer 330, and the upper electrode 340 may be formed.

The first thin film encapsulation layer 451 may be formed on the upper electrode 340. The first thin film encapsulation layer 451 may be formed along a profile of the upper electrode 340 with a substantially uniform thickness to cover the upper electrode 340. The first thin film encapsulation layer 451 may be formed by using inorganic materials having flexibility.

The second thin film encapsulation layer 452 may be formed on the first thin film encapsulation layer 451. The second thin film encapsulation layer 452 may include organic materials having flexibility.

The third thin film encapsulation layer 453 may be formed on the second thin film encapsulation layer 452. The third thin film encapsulation layer 453 may be formed along a profile of the second thin film encapsulation layer 452 with a substantially uniform thickness to cover the second thin film encapsulation layer 452. The third thin film encapsulation layer 453 may be formed by using inorganic materials having flexibility.

Accordingly, the thin film encapsulation structure 450 including the first thin film encapsulation layer 451, the second thin film encapsulation layer 452, and the third thin film encapsulation layer 453 may be formed.

Figure 17:
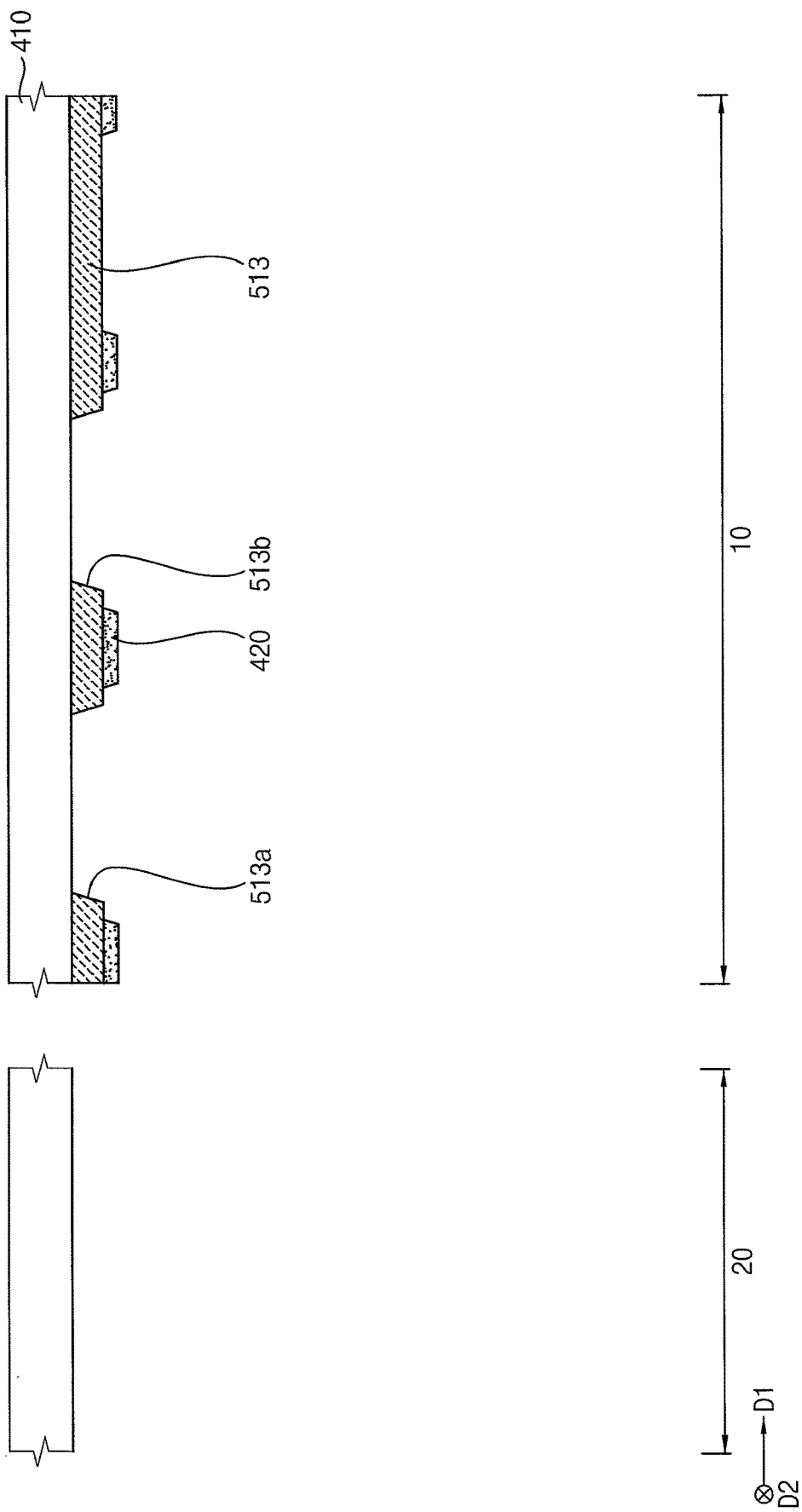

Referring to FIG. 17, the upper substrate 410 may be provided. The upper substrate 410 and the lower substrate 110 may include substantially the same material. For example, the upper substrate 410 may include a quartz substrate, a synthetic quartz substrate, a calcium fluoride substrate, a fluorine-doped quartz substrate, a soda lime glass substrate, a non-alkali glass substrate, etc.

The first color filter 513 may be formed in the display area 10 and on a bottom surface of the upper substrate 410. The first color filter 513 may have first openings 513a and second openings 513b in the display area 10. In an exemplary embodiment of the present invention, the first color filter 513 may transmit blue light, and may be a color filter having a blue color. As shown in FIG. 2, the first color filter 513 may include an opening area 11 and a light transmission area 12. The first openings 513a and the second openings 513b may be located in the opening area 11. No opening may be formed in the light transmission area 12. The sub-pixel areas 30 located in the light transmission area 12 may overlap the third sub-pixel structure, and a portion overlapping the sub-pixel areas 30 located in the light transmission area 12 may function as the first color filter 513.

The upper light blocking layer 420 may be formed on a bottom surface of the first color filter 513. The upper light blocking layer 420 may include a plurality of openings. For example, the upper light blocking layer 420 may have a plate shape including a plurality of openings. The openings of the upper light blocking layer 420 located in the opening area 11 of the first color filter 513 may overlap the first openings 513a and the second openings 513b, and the openings of the upper light blocking layer 420 located in the light transmission area 12 of the first color filter 513 may overlap the first color filter 513 serving as a color filter.

The upper light blocking layer 420 may block or absorb light incident from an outside. The upper light blocking layer 420 may be formed by using an organic material such as a photoresist, a polyacryl-based resin, a polyimide-based resin, a polyamide-based resin, a siloxane-based resin, an acryl-based resin, or an epoxy-based resin. In addition, the upper light blocking layer 420 may be substantially opaque. For example, the upper light blocking layer 420 may further include a light blocking material to absorb the light. The light blocking material may include carbon black, titanium nitride oxide, titanium black, phenylene black, aniline black, cyanine black, nigrosine acid black, a black resin, and the like. In an exemplary embodiment of the present invention, the upper light blocking layer 420 may not be formed on the bottom surface of the first color filter 513.

Figure 18:
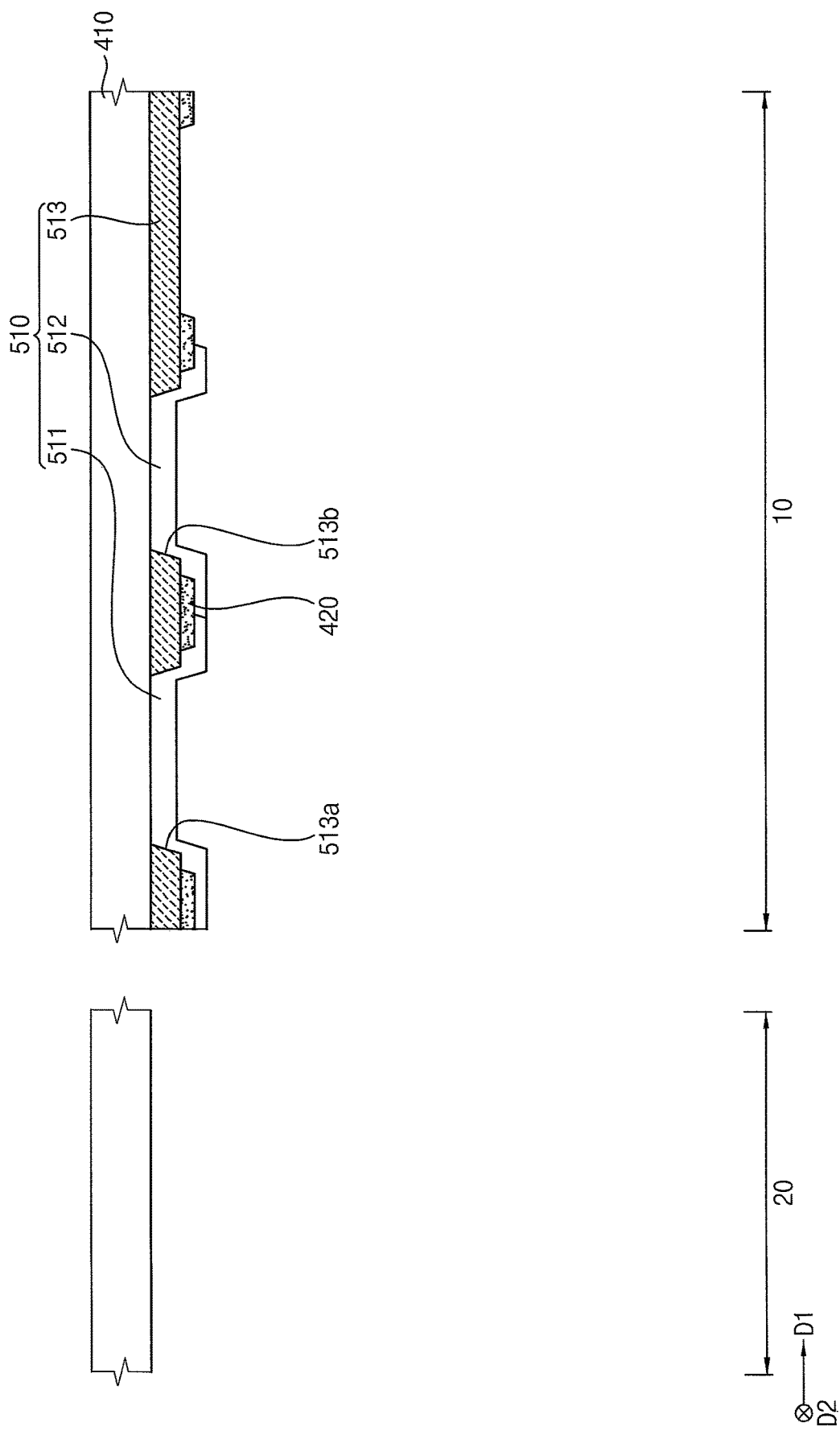

Referring to FIG. 18, the second color filter 511 may be formed in the first opening 513a of the first color filter 513 and the opening of the upper light blocking layer 420 on the bottom surface of the upper substrate 410. In addition, a portion of the second color filter 511 may be formed on a portion of a bottom surface of the upper light blocking layer 420. In an exemplary embodiment of the present invention, the second color filter 511 may transmit red light, and may be a color filter having a red color.

The third color filter 512 may be formed in the second opening 513b of the first color filter 513 and the opening of the upper light blocking layer 420 on the bottom surface of the upper substrate 410. In addition, a portion of the third color filter 512 may be formed on a portion of the bottom surface of the upper light blocking layer 420, and may make contact with or overlap the second color filter 511 on the bottom surface of the upper light blocking layer 420. In an exemplary embodiment of the present invention, the third color filter 512 may transmit green light, and may be a green color filter.

Accordingly, the color filters 510 including the first color filter 513, the second color filter 511, and the third color filter 512 may be formed. The color filters 510 may be formed by using a photosensitive resin and a color photoresist.

Figure 19:
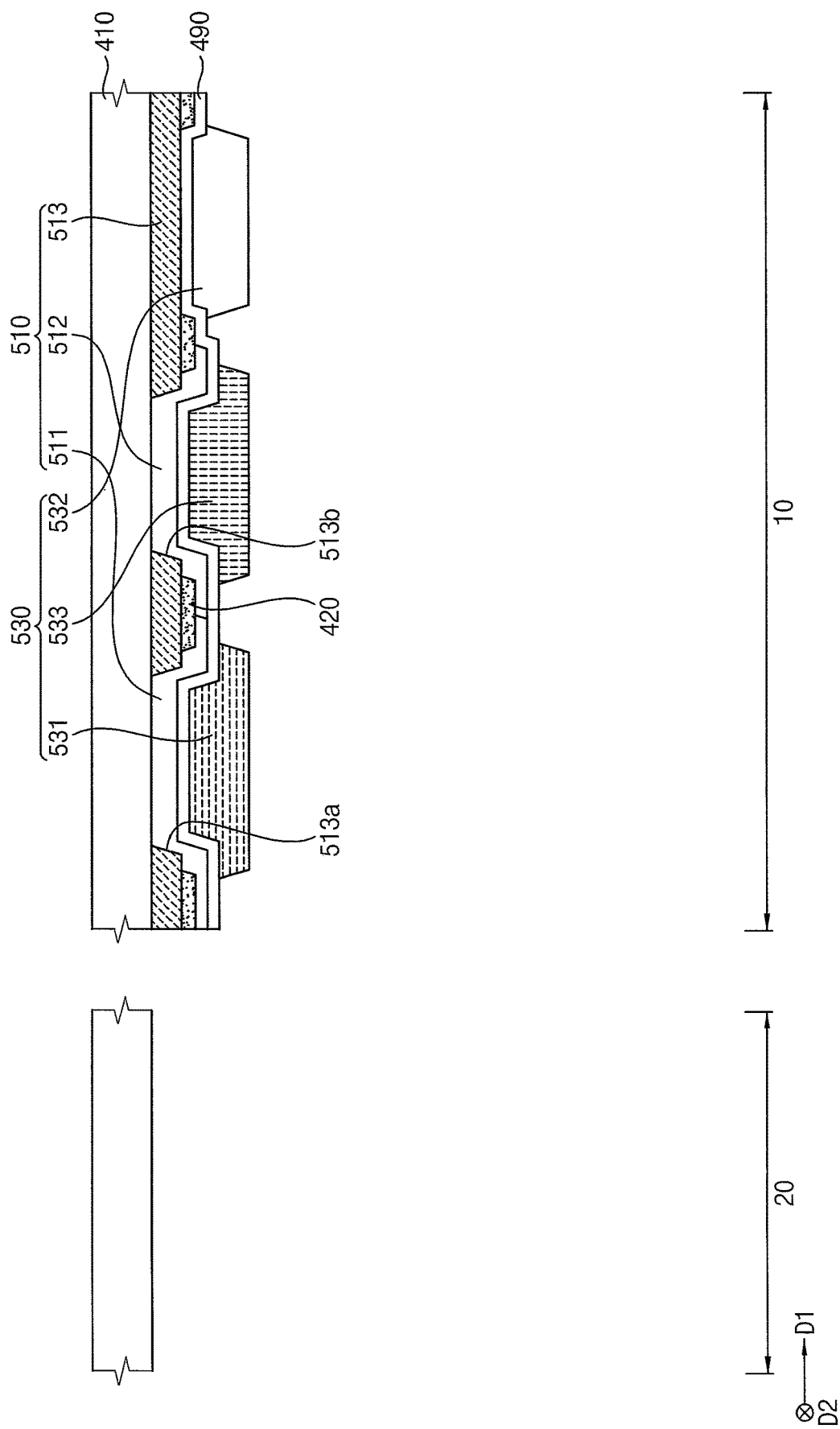

Referring to FIG. 19, the first protective insulating layer 490 may be formed under the color filters 510 and the upper light blocking layer 420. The first protective insulating layer 490 may cover the color filters 510 and the upper light blocking layer 420 on the bottom surface of the upper substrate 410. For example, the first protective insulating layer 490 may be formed along a profile of the color filters 510 and the upper light blocking layer 420 with a substantially uniform thickness to cover the color filters 510 and the upper light blocking layer 420 on the bottom surface of the upper substrate 410. In an exemplary embodiment of the present invention, the first protective insulating layer 490 may sufficiently cover the color filters 510 and the upper light blocking layer 420 on the bottom surface of the upper substrate 410, and may have a substantially flat top surface without creating a step around the color filters 510 and the upper light blocking layer 420. The first protective insulating layer 490 may be formed by using an inorganic material or an organic material.

The optical filters 530 may be formed on the bottom surface of the first protective insulating layer 490 to overlap the color filters 510. The optical filters 530 may include a first quantum dot pattern 531 for converting blue light into red light, a second quantum dot pattern 533 for converting the blue light into green light, and a scattering pattern 532 for transmitting the blue light.

The first quantum dot pattern 531 may be formed under the second color filter 511 to overlap the second color filter 511, the second quantum dot pattern 533 may be formed under the third color filter 512 to overlap the third color filter 512, and the scattering pattern 532 may be formed under the first color filter 513 to overlap the first color filter 513. In an exemplary embodiment of the present invention, the first quantum dot pattern 531, the second quantum dot pattern 533, and the scattering pattern 532 may be spaced apart from each other, and may be disposed on the same layer. The first quantum dot pattern 531 may include a plurality of quantum dots for absorbing the blue light and emitting the red light, the second quantum dot pattern 533 may include a plurality of quantum dots for absorbing the blue light and emitting the green light, and the scattering pattern 532 may include a scattering material for emitting the blue light as it is.

For example, the quantum dots included in the first quantum dot pattern 531 and the second quantum dot pattern 533 may be formed by using one of nanocrystals including a silicon-based nanocrystal, a group II-VI compound-based semiconductor nanocrystal, a group III-V compound-based semiconductor nanocrystal, a group IV-VI compound-based semiconductor nanocrystal, and mixtures thereof.

Even if the quantum dots included in the first and second quantum dot patterns 531 and 532 include the same material, an emission wavelength may vary according to a size of the quantum dot. For example, as the size of the quantum dot becomes smaller, light having a shorter wavelength may be emitted. Therefore, light within a desired visible light range may be emitted by controlling the sizes of the quantum dots included in the first and second quantum dot patterns 531 and 532.

The scattering pattern 532 may be formed by using TiO, ZrO, $AlO_3$, $In_2O_3$, ZnO, $SnO_2$, $Sb_2O_3$, ITO, etc. However, the material of the scattering pattern 532 is not limited thereto, and may vary as long as the material allows the blue light to be scattered without being converted.

Accordingly, the optical filters 530 including the first quantum dot pattern 531, the second quantum dot pattern 533, and the scattering pattern 532 may be formed.

Figure 20:
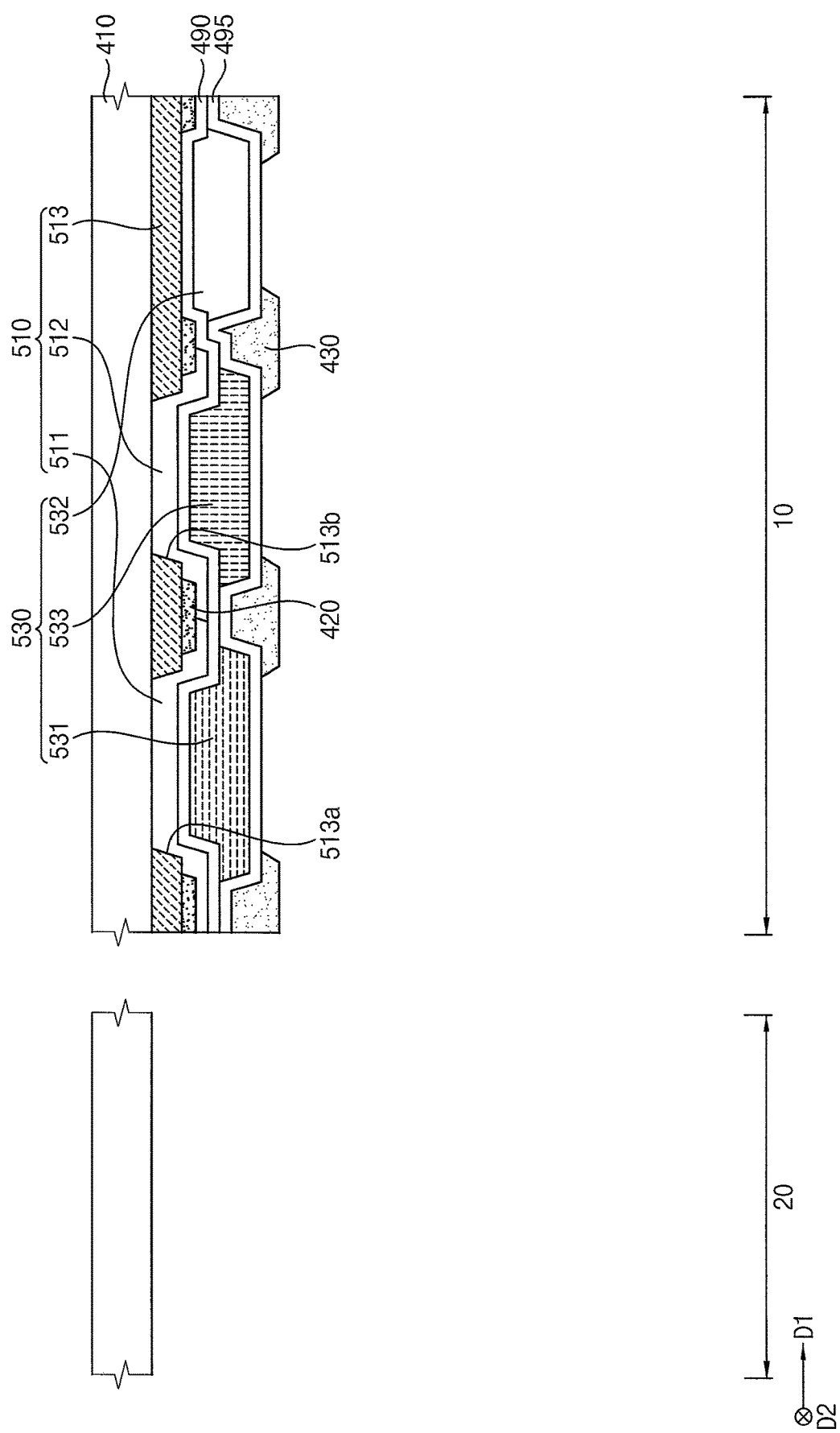
Figure 21:
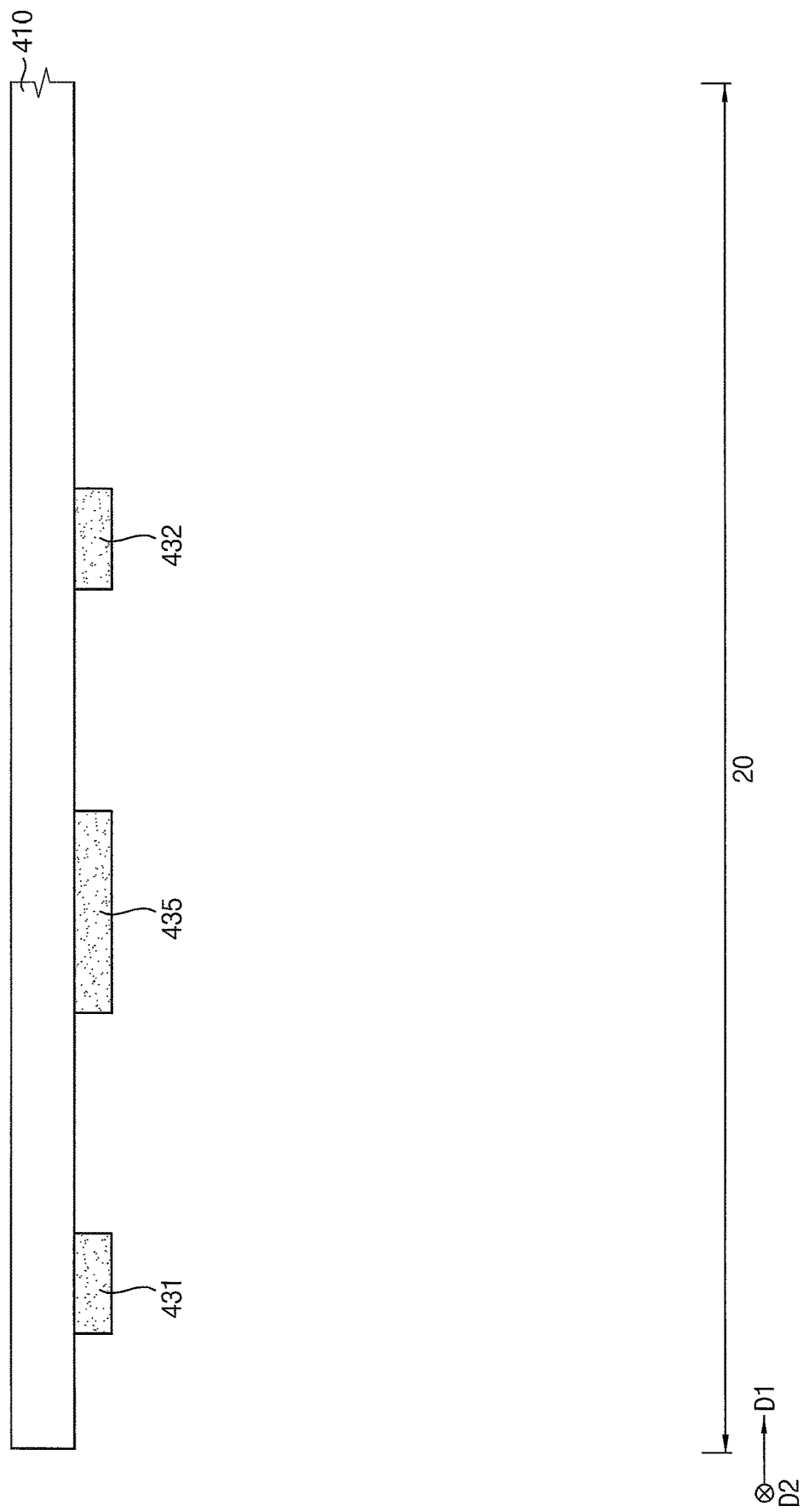

Referring to FIGS. 20 and 21, the second protective insulating layer 495 may be formed under the optical filters 530 and the first protective insulating layer 490. The second protective insulating layer 495 may cover the optical filters 530 on a bottom surface of the first protective insulating layer 490. In an exemplary embodiment of the present invention, the second protective insulating layer 495 may make contact with the first protective insulating layer 490 at a space between the optical filters 530. For example, the second protective insulating layer 495 may be formed along a profile of the optical filters 530 with a substantially uniform thickness to cover the optical filters 530 on the bottom surface of the first protective insulating layer 490. In an exemplary embodiment of the present invention, the second protective insulating layer 495 may sufficiently cover the optical filters 530 on the bottom surface of the first protective insulating layer 490, and may have a substantially flat top surface without creating a step around the optical filters 530. The second protective insulating layer 495 may be formed by using an inorganic material or an organic material.

The lower light blocking layer 430 may be formed on a bottom surface of the second protective insulating layer 495. The lower light blocking layer 430 may be formed at the space between the optical filters 530 on the bottom surface of the second protective insulating layer 495. The lower light blocking layer 430 may include a plurality of openings. For example, the lower light blocking layer 430 may have a plate shape including a plurality of openings.

The openings of the lower light blocking layer 430 may correspond to the openings of the upper light blocking layer 420 and the sub-pixel areas 30, respectively. In addition, the openings of the lower light blocking layer 430 located in the opening area 11 of the first color filter 513 may overlap the first openings 513a and the second openings 513b, and the openings of the lower light blocking layer 430 located in the light transmission area 12 of the first color filter 513 may overlap the first color filter 513 functioning as a color filter.

The lower light blocking layer 430 may prevent a color mixture phenomenon that may occur in adjacent optical filters 530. For example, when the lower light blocking layer 430 is not formed, a portion of light incident on the second quantum dot pattern 533 may be incident on the first quantum dot pattern 531, and the remaining portion of the light may be incident on the scattering pattern 532. In this case, the color mixture phenomenon may occur. In an exemplary embodiment of the present invention, the lower light blocking layer 430 may block or absorb the light incident from the outside, and may reflect the light emitted from the light emitting layer 330.

The lower light blocking layer 430 and the upper light blocking layer 420 may include substantially the same material. For example, the lower light blocking layer 430 may be formed by using an organic material and a light blocking material.

As shown in FIG. 21, first to fourth outer peripheral patterns 431, 432, 433, and 434 and a reference pattern 435 may be formed in the peripheral area 20 on the bottom surface of the upper substrate 410. In an exemplary embodiment of the present invention, the lower light blocking layer 430, the first to fourth outer peripheral patterns 431, 432, 433, and 434, and the reference pattern 435 may be simultaneously formed by using the same material.

Accordingly, the alignment structure 401 including the first to fourth outer peripheral patterns 431, 432, 433, 434, the reference pattern 435, the first pattern 311, and the second pattern 171 may be formed.

Figure 22:
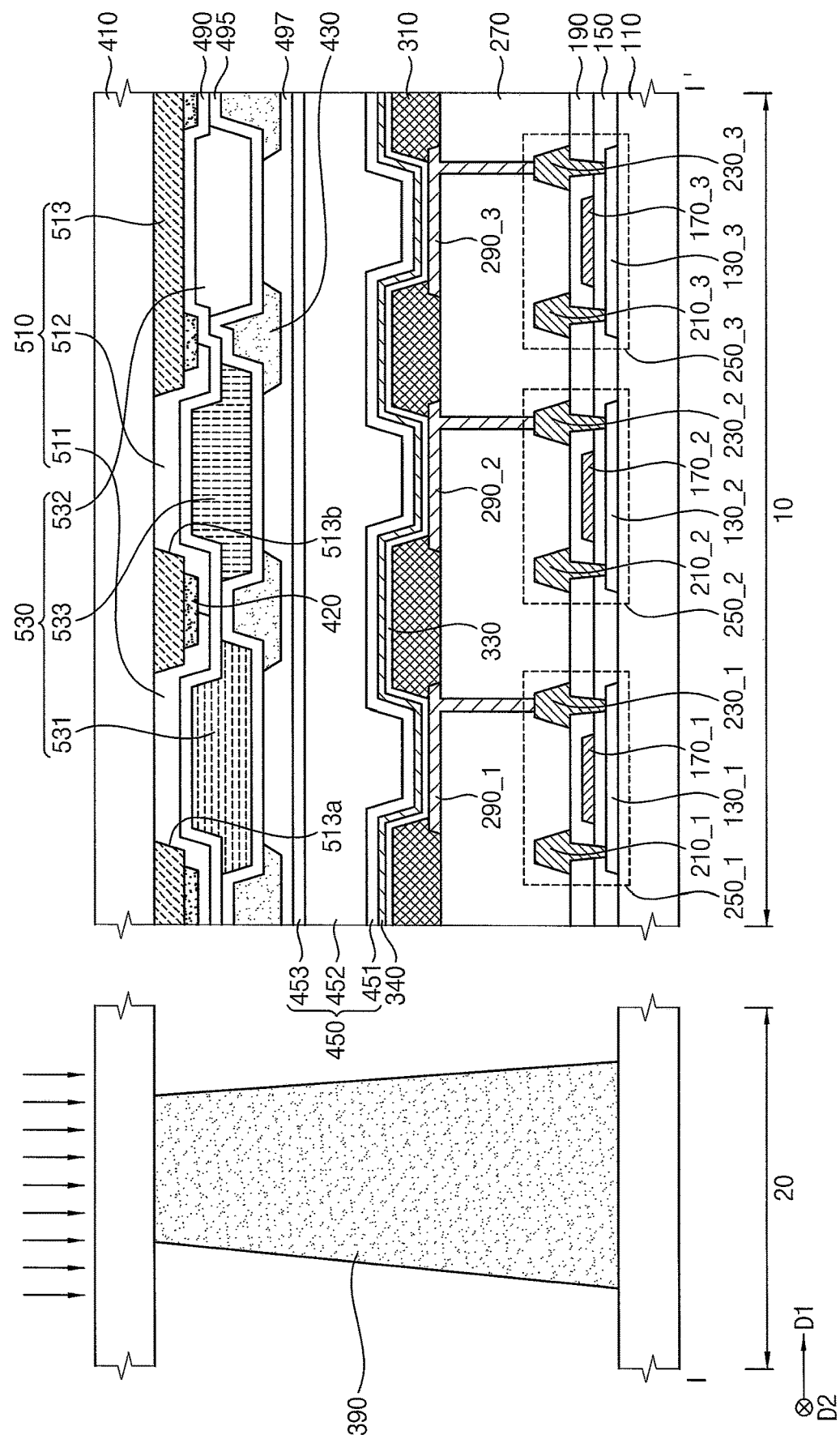
Figure 23:
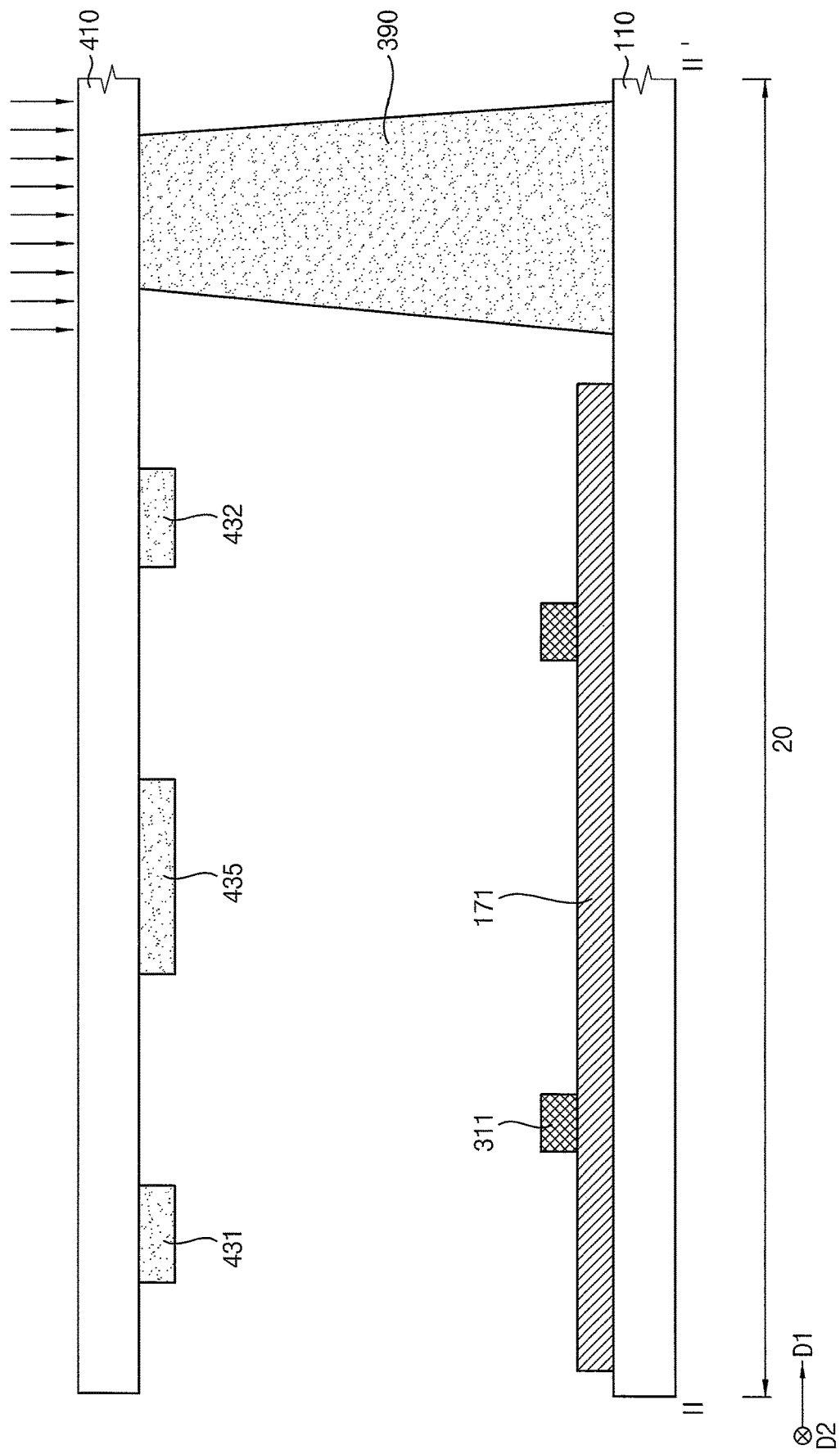

Referring to FIGS. 22 and 23, the intermediate layer 497 may be formed under the lower light blocking layer 430 and the second protective insulating layer 495. The intermediate layer 497 may be formed on the bottom surface of the second protective insulating layer 495 to cover the lower light blocking layer 430. For example, the intermediate layer 497 may have a relatively thick thickness to sufficiently cover the lower light blocking layer 430 on the bottom surface of the second protective insulating layer 495. The intermediate layer 497 may be formed by using, for example, an organic material, an inorganic material, or the like.

The sealing member 390 may be disposed in the peripheral area 20 on the lower substrate 110. The sealing member 390 may have, for example, a trapezoidal shape. In an exemplary embodiment of the present invention, the sealing member 390 may be formed in the peripheral area 20 and on the upper substrate 410. In this case, the sealing member 390 may have an inverted trapezoidal shape. The sealing member 390 may be formed by using a non-conductive material. For example, the sealing member 390 may include a frit, etc. In addition, the sealing member 390 may further include a photocurable material. For example, the sealing member 390 may include a mixture of an organic material and a photocurable material. The photocurable material included in the sealing member 390 may include an epoxy acrylate-based resin, a polyester acrylate-based resin, a urethane acrylate-based resin, a polybutadiene acrylate-based resin, a silicone acrylate-based resin, an alkyl acrylate-based resin, etc.

After the sealing member 390 is formed, the bottom surface of the upper substrate 410 may make contact with the sealing member 390 by using the alignment structure 401.

Next, ultraviolet light, laser light, visible light, or the like may be irradiated onto the sealing member 390. For example, the laser light may be irradiated to the sealing member 390. As the laser light is irradiated, the mixture may be changed from a solid state to a liquid state, and the mixture in the liquid state may be cured back to the solid state after a predetermined time. According to a state change of the mixture, the upper substrate 410 may be sealed and coupled to the lower substrate 110.

Accordingly, the display device 500 shown in FIGS. 6 and 7 may be manufactured.

The present invention may be applied to various electronic devices including a display device. For example, the present invention may be applied to vehicle-display device, a ship-display device, an aircraft-display device, portable communication devices, display devices for display or for information transfer, a medical-display device, etc.

While the present invention has been described with reference to exemplary embodiments thereof, it will be understood by those of ordinary skill in the art that various changes in form and details may be made thereto without departing from the spirit and scope of the present invention.

What is claimed is:

1. A display device comprising:
a lower substrate having a display area and a peripheral area at least partially surrounding the display area;
a plurality of lower electrodes disposed in the display area and on the lower substrate;
a pixel defining layer configured to cover a portion of each of the lower electrodes;
a light emitting layer disposed on the lower electrodes and the pixel defining layer;
an upper electrode disposed on the light emitting layer;
a plurality of optical filters disposed on the upper electrode and spaced apart from each other;
a lower light blocking layer disposed between the optical filters, and having a plurality of openings;
an upper substrate disposed on the lower light blocking layer to oppose the lower substrate; and
an alignment structure disposed in the peripheral area of the lower substrate and the upper substrate, and including a material identical to a material of the pixel defining layer and the lower light blocking layer, wherein the alignment structure includes:
a first alignment pattern disposed on a bottom surface of the upper substrate; and
a second alignment pattern disposed on a top surface of the lower substrate,
wherein the first alignment pattern includes:
a reference pattern; and
outer peripheral patterns spaced apart from the reference pattern while surrounding the reference pattern,
wherein the outer peripheral patterns are spaced apart from each other.

2. The display device of claim 1, wherein the lower electrodes, the optical filters, and the openings of the lower light blocking layer overlap each other.

3. The display device of claim 1, wherein the lower light blocking layer overlaps the pixel defining layer.

4. The display device of claim 1, wherein the first alignment pattern and the lower light blocking layer include a same material, and
the second alignment pattern and the pixel defining layer include a same material.

5. The display device of claim 1, wherein each of the outer peripheral patterns is spaced apart from the reference pattern at a same interval.

6. The display device of claim 1, wherein the second alignment pattern includes a first pattern disposed between the reference pattern and the outer peripheral patterns, wherein the first pattern has a rectangular shape including an opening, and
wherein the opening of the first pattern overlaps the reference pattern.

7. The display device of claim 1, wherein the second alignment pattern includes a first pattern disposed between the reference pattern and the outer peripheral patterns, wherein the first pattern has a rectangular shape including an opening, and
wherein the first pattern surrounds the reference pattern without overlapping the reference pattern and the outer peripheral patterns.

8. The display device of claim 1, wherein the second alignment pattern includes:

a first pattern disposed between the reference pattern and the outer peripheral patterns, wherein the first pattern has a rectangular shape including an opening; and a second pattern disposed between the first pattern and the lower substrate to overlap the reference pattern, the outer peripheral pattern, and the first pattern.

9. The display device of claim 8, wherein the second pattern includes a metal material.

10. The display device of claim 1, further comprising a plurality of color filters disposed between the lower substrate and the upper substrate, wherein the color filters overlap the optical filters, respectively.

11. The display device of claim 10, further comprising:

a first protective insulating layer disposed between the optical filters and the color filters; and a second protective insulating layer disposed between the lower light blocking layer and the optical filters, wherein the first protective insulating layer and the second protective insulating layer make contact with each other between the optical filters.

12. The display device of claim 10, wherein the color filters include:

a first color filter disposed on a bottom surface of the upper substrate to transmit blue light, and having a plurality of first openings and a plurality of second openings;

second color filters respectively disposed in the first openings on the bottom surface of the upper substrate to transmit red light; and third color filters respectively disposed in the second openings on the bottom surface of the upper substrate to transmit green light.

13. The display device of claim 12, further comprising an upper light blocking layer disposed between the first color filter and the lower light blocking layer, and having a plurality of openings, wherein the openings of the upper light blocking layer overlap the openings of the lower light blocking layer.

14. The display device of claim 12, wherein the optical filters include:

a first quantum dot pattern disposed on the second color filters to convert the blue light into the red light;

a second quantum dot pattern disposed on the third color filters to convert the blue light into the green light; and a scattering pattern disposed on the first color filter to transmit the blue light.

15. The display device of claim 14, wherein the first color filter includes an opening area and a light transmission area, the first and second openings are located in the opening area, and the scattering pattern overlaps the light transmission area.

16. The display device of claim 1, further comprising:

a thin film encapsulation structure disposed in the display area between the upper electrode and the lower light blocking layer; and a sealing member surrounding the display area in the peripheral area between the lower substrate and the upper substrate.

17. The display device of claim 1, wherein the light emitting layer is configured to emit blue light, and the light emitting layer is integrally formed in the display area on the lower substrate.

* * * * *